US012610560B2

(12) United States Patent
Kim et al.

(10) Patent No.: US 12,610,560 B2
(45) Date of Patent: Apr. 21, 2026

(54) SEMICONDUCTOR PACKAGE

(71) Applicant: Samsung Electronics Co., Ltd., Suwon-si (KR)

(72) Inventors: Joonsung Kim, Suwon-si (KR); Jihwang Kim, Suwon-si (KR); Jeongho Lee, Suwon-si (KR); Dongwook Kim, Suwon-si (KR); Wonkyoung Choi, Suwon-si (KR); Yunseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 453 days.

(21) Appl. No.: 18/125,928

(22) Filed: Mar. 24, 2023

(65) Prior Publication Data

US 2024/0040806 A1      Feb. 1, 2024

(30) Foreign Application Priority Data

Jul. 29, 2022      (KR) ........................ 10-2022-0095005

(51) Int. Cl.
*H01L 23/498*          (2006.01)
*H01L 23/00*          (2006.01)
(Continued)

(52) U.S. Cl.
CPC ......... *H10B 80/00* (2023.02); *H01L 23/3128* (2013.01); *H01L 23/36* (2013.01);
(Continued)

(58) Field of Classification Search
CPC ....... H01L 21/6835; H01L 2221/68345; H01L 2221/68359; H01L 2224/16227;
(Continued)

(56) References Cited

U.S. PATENT DOCUMENTS 9,082,743 B2 *   7/2015   Hung ...................... H01L 24/73
9,087,839 B2 *   7/2015   Adderly .............. H01L 23/5223
(Continued)

FOREIGN PATENT DOCUMENTS

KR          10-2295360 B1     9/2021
KR       1020210110008 A      9/2021

*Primary Examiner* — Telly D Green
(74) *Attorney, Agent, or Firm* — Muir Patent Law, PLLC

(57)          ABSTRACT

A semiconductor package includes a lower package, an upper package on the lower package, and an inter-package connector between the lower package and the upper package. The lower package includes a first redistribution structure, a first semiconductor chip mounted on a first mounting region of the first redistribution structure, a second semiconductor chip mounted on a second mounting region of the first redistribution structure, a molding layer on the first redistribution structure and in contact with a side wall of the first semiconductor chip and a side wall of the second semiconductor chip, and a conductive post passing through the molding layer and electrically connected to the first semiconductor chip through a first redistribution pattern of the first redistribution structure. The upper package is on the molding layer, vertically overlaps with the second mounting region of the first redistribution structure, and does not cover the first semiconductor chip.

20 Claims, 18 Drawing Sheets

(51) Int. Cl.

| | |
|---|---|
| *H01L 23/31* | (2006.01) |
| *H01L 23/36* | (2006.01) |
| *H01L 23/538* | (2006.01) |
| *H10B 80/00* | (2023.01) |

(52) U.S. Cl.
CPC .... *H01L 23/49811* (2013.01); *H01L 23/5383* (2013.01); *H01L 24/16* (2013.01); *H01L 24/32* (2013.01); *H01L 24/73* (2013.01); *H01L 2224/16227* (2013.01); *H01L 2224/32245* (2013.01); *H01L 2224/73253* (2013.01)

(58) Field of Classification Search
CPC . H01L 2224/32245; H01L 2224/73253; H01L 2224/81; H01L 23/3128; H01L 23/36; H01L 23/49811; H01L 23/49816; H01L 23/5383; H01L 23/5384; H01L 23/5385; H01L 23/5389; H01L 24/16; H01L 24/19; H01L 24/20; H01L 24/32; H01L 24/73; H10B 80/00
See application file for complete search history.

(56) References Cited

U.S. PATENT DOCUMENTS

| | | | | |
|---|---|---|---|---|
| 9,331,021 | B2 * | 5/2016 | Yu | H01L 23/3128 |
| 10,297,471 | B2 | 5/2019 | Yu et al. | |
| 10,347,574 | B2 | 7/2019 | Jeng et al. | |
| 10,504,841 | B2 * | 12/2019 | Huang | H01L 21/565 |
| 10,818,651 | B2 * | 10/2020 | Hsu | H01L 24/19 |
| 11,018,124 | B2 | 5/2021 | Collins | |
| 11,139,249 | B2 | 10/2021 | Yu et al. | |
| 11,296,004 | B2 | 4/2022 | Yoo et al. | |
| 11,296,067 | B2 * | 4/2022 | Hsu | H01L 23/36 |
| 11,798,909 | B2 * | 10/2023 | Hsu | H01L 23/5389 |
| 11,824,054 | B2 * | 11/2023 | Hsu | H01L 23/5386 |
| 12,087,729 | B2 * | 9/2024 | Chang | H01L 23/585 |
| 12,261,102 | B2 * | 3/2025 | Liao | H01L 23/49822 |
| 12,261,163 | B2 * | 3/2025 | Chen | H01L 25/0655 |
| 12,266,648 | B2 * | 4/2025 | Hsu | H01L 21/6835 |
| 2014/0264800 | A1 * | 9/2014 | Gowda | H01L 23/49541 |
| | | | | 438/122 |
| 2015/0115464 | A1 * | 4/2015 | Yu | H01L 24/32 |
| | | | | 438/109 |
| 2015/0162265 | A1 | 6/2015 | Jo et al. | |
| 2016/0133602 | A1 | 5/2016 | Chen et al. | |
| 2017/0084555 | A1 * | 3/2017 | Yu | H01L 24/82 |
| 2017/0084576 | A1 * | 3/2017 | Yu | H01L 25/18 |
| 2019/0148276 | A1 * | 5/2019 | Chen | H01L 24/73 |
| | | | | 257/774 |
| 2019/0287924 | A1 * | 9/2019 | Moon | H01L 24/82 |
| 2020/0020638 | A1 * | 1/2020 | Heo | H01L 23/5383 |
| 2020/0066639 | A1 * | 2/2020 | Lee | H01L 23/5386 |
| 2020/0243497 | A1 * | 7/2020 | Hsu | H01L 21/4857 |
| 2020/0294917 | A1 * | 9/2020 | Lee | H01L 25/105 |
| 2020/0411499 | A1 * | 12/2020 | Hsu | H01L 24/17 |
| 2021/0082888 | A1 * | 3/2021 | Lai | H01L 24/24 |
| 2021/0111163 | A1 | 4/2021 | Bae et al. | |
| 2021/0143126 | A1 * | 5/2021 | Choi | H01L 25/0652 |
| 2021/0335729 | A1 * | 10/2021 | Lu | H01L 21/6835 |
| 2021/0375810 | A1 * | 12/2021 | Kim | H01L 23/49822 |
| 2022/0216194 | A1 * | 7/2022 | Hsu | H01L 24/73 |
| 2022/0328467 | A1 * | 10/2022 | Chen | H01L 23/481 |
| 2022/0359405 | A1 * | 11/2022 | Chen | H01L 24/92 |
| 2022/0367374 | A1 * | 11/2022 | Yu | H01L 21/6835 |
| 2022/0375829 | A1 * | 11/2022 | Hwang | H01L 23/49833 |
| 2023/0378152 | A1 * | 11/2023 | Hsu | H01L 24/20 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0095005, filed on Jul. 29, 2022, in the Korean Intellectual Property Office, the disclosure of which is incorporated by reference herein in its entirety.

BACKGROUND

The inventive concept relates to a semiconductor package, and more particularly, to a semiconductor package including a plurality of semiconductor chips.

With the rapid development of the electronics industry and user needs, electronic equipment has become more compact and multifunctional and has achieved a higher capacity. Accordingly, a semiconductor package including a plurality of semiconductor chips is required. For example, various kinds of semiconductor chips may be mounted on a single package substrate side-by-side, or semiconductor chips and/or packages may be stacked on a single package substrate.

SUMMARY

The inventive concept provides a semiconductor package including a plurality of semiconductor chips.

According to an aspect of the inventive concept, there is provided a semiconductor package including a lower package, an upper package on the lower package, and an inter-package connector between the lower package and the upper package, wherein the lower package includes a first redistribution structure including a first redistribution insulating layer and a first redistribution pattern, a first semiconductor chip mounted on a first mounting region of the first redistribution structure, a second semiconductor chip mounted on a second mounting region of the first redistribution structure, the second mounting region of the first redistribution structure being spaced apart the first mounting region of the first redistribution structure, a molding layer on the first redistribution structure and in contact with a side wall of the first semiconductor chip and a side wall of the second semiconductor chip, the molding layer having a top surface coplanar with a top surface of the first semiconductor chip, and a conductive post on the second mounting region of the first redistribution structure, the conductive post passing through the molding layer and being electrically connected to the first semiconductor chip through the first redistribution pattern of the first redistribution structure, the first semiconductor chip includes a logic chip, the upper package includes a memory chip electrically connected to the first semiconductor chip through the conductive post, and the upper package vertically overlaps with the second mounting region of the first redistribution structure and does not cover the first semiconductor chip.

According to another aspect of the inventive concept, there is provided a semiconductor package including a first redistribution structure including a first mounting region and a second mounting region spaced apart from the first mounting region, a first semiconductor chip mounted on the first mounting region of the first redistribution structure, a molding layer contacting a top surface of the first redistribution structure and a side wall of the first semiconductor chip and not covering a top surface of the first semiconductor chip, a vertical connection conductor in the molding layer, the vertical connection conductor being electrically connected to the first semiconductor chip through a first redistribution pattern of the first redistribution structure, and an upper semiconductor chip on the molding layer, the upper semiconductor chip vertically overlapping with the second mounting region of the first redistribution structure and being electrically connected to the first semiconductor chip through the vertical connection conductor, wherein the upper semiconductor chip does not cover the top surface of the first semiconductor chip.

According to a further aspect of the inventive concept, there is provided a semiconductor package including a lower package, an upper package on the lower package, and an inter-package connector between the lower package and the upper package, wherein the lower package includes a first redistribution structure including a first redistribution insulating layer and a first redistribution pattern, a first semiconductor chip mounted on a first mounting region of the first redistribution structure, a second semiconductor chip mounted on a second mounting region of the first redistribution structure, the second mounting region of the first redistribution structure being spaced apart from the first mounting region of the first redistribution structure, a molding layer on the first redistribution structure and in contact with a side wall of the first semiconductor chip and a side wall of the second semiconductor chip, a conductive post in the second mounting region of the first redistribution structure, the conductive post passing through the molding layer, and a heat dissipation plate attached to a top surface of the first semiconductor chip, wherein the upper package includes a third semiconductor chip electrically connected through the conductive post to at least one selected from a group consisting of the first semiconductor chip and the second semiconductor chip, and the upper package is spaced apart from the heat dissipation plate in a lateral direction parallel with a top surface of the molding layer and does not cover the top surface of the first semiconductor chip.

BRIEF DESCRIPTION OF THE DRAWINGS

Embodiments will be more clearly understood from the following detailed description taken in conjunction with the accompanying drawings in which:

FIG. 1 is a cross-sectional view of a semiconductor package, according to example embodiments;

FIG. 6 is a cross-sectional view of a semiconductor package, according to example embodiments;

FIG. 7 is a cross-sectional view of a semiconductor package, according to example embodiments;

FIG. 8 is a cross-sectional view of a semiconductor package, according to example embodiments;

FIG. 10 is a cross-sectional view of a semiconductor package, according to example embodiments.

DETAILED DESCRIPTION OF THE EMBODIMENTS

Figure 2:
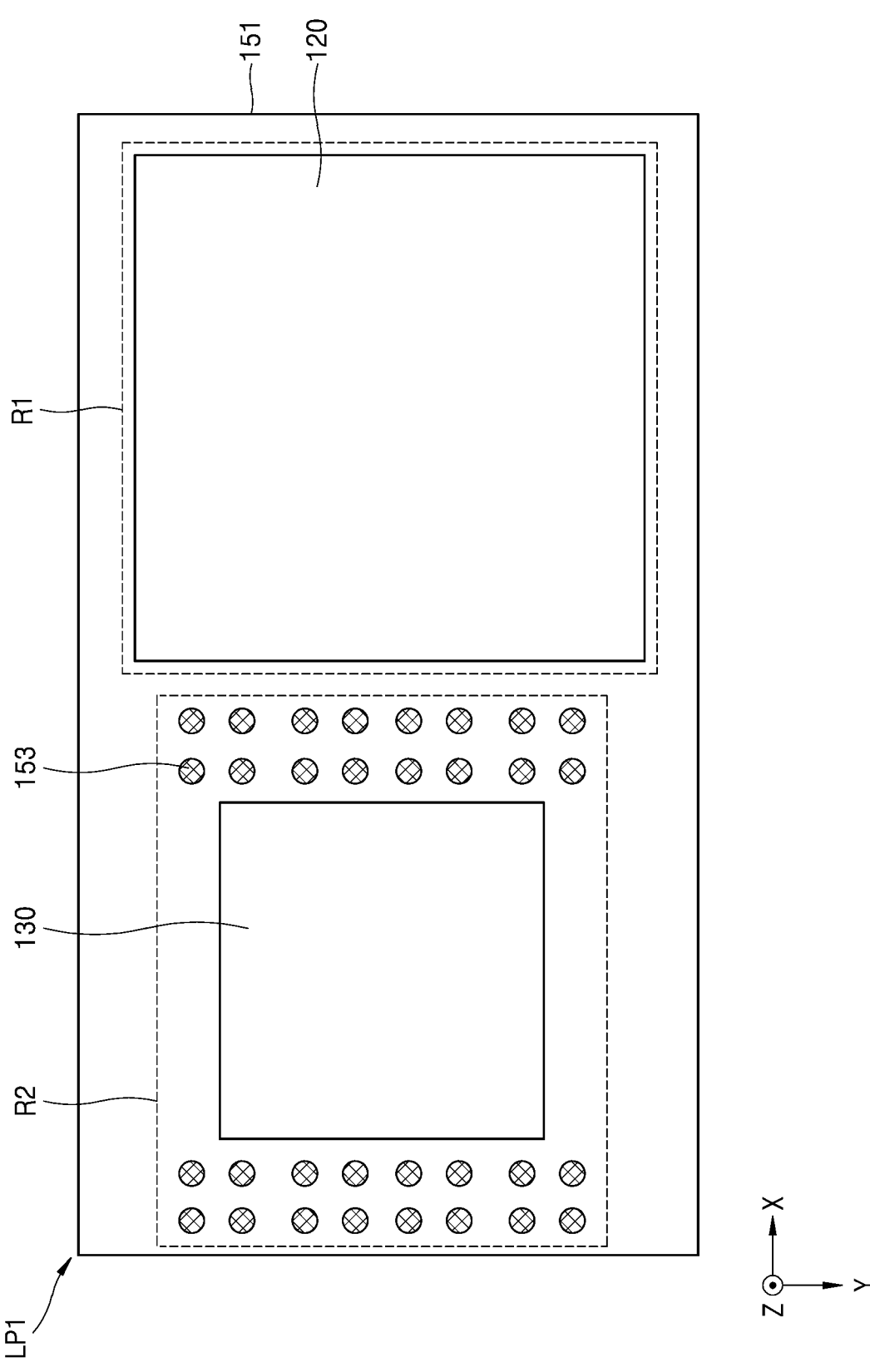
FIG. 2 is a plan view of a lower package of the semiconductor package of FIG. 1.

Hereinafter, embodiments will be described with reference to the attached drawings. In the drawings, like numerals denote like elements and redundant descriptions thereof will be omitted.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1:
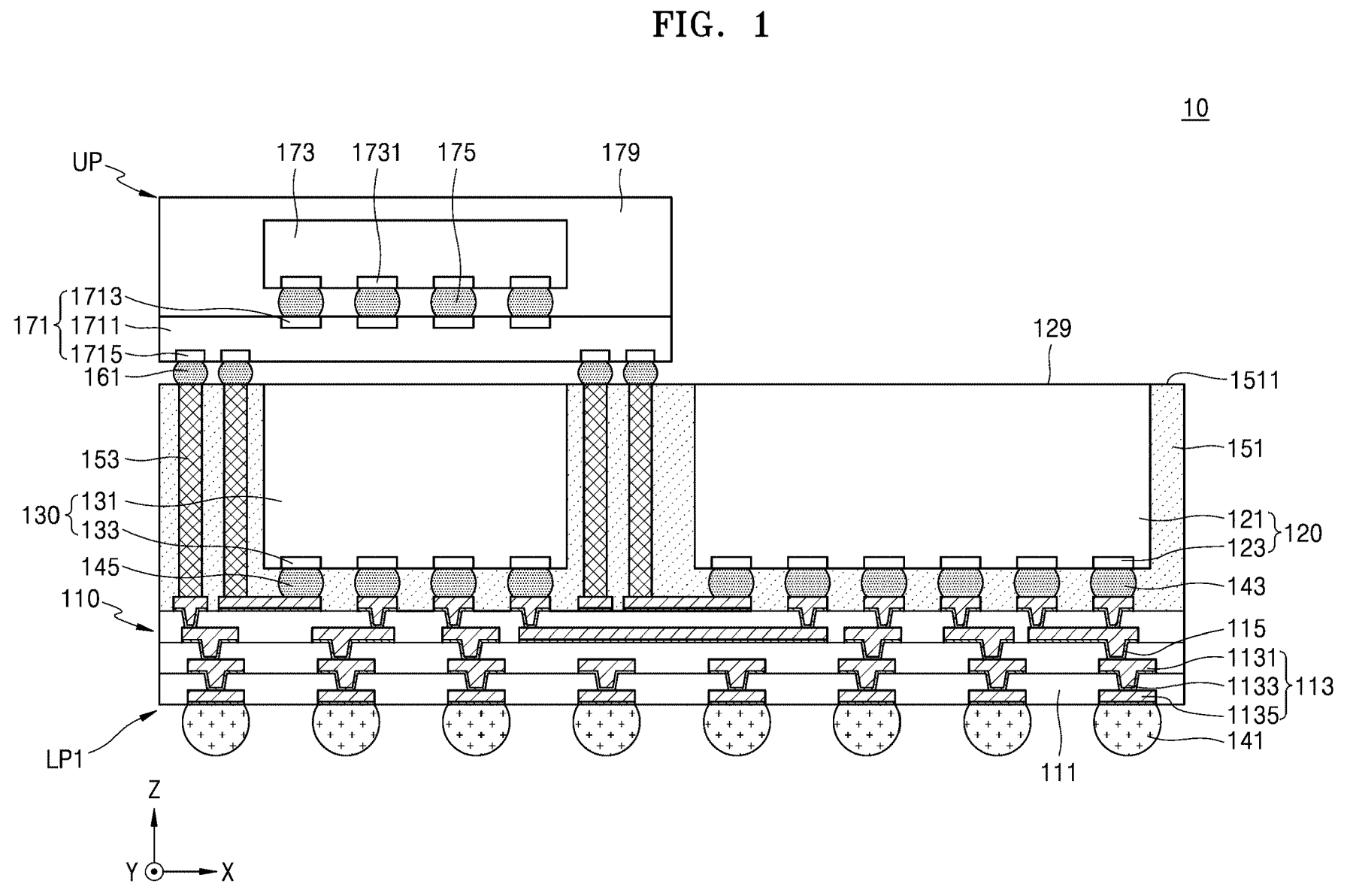

FIG. 1 is a cross-sectional view of a semiconductor package 10 according to example embodiments. FIG. 2 is a plan view of a lower package LP1 of the semiconductor package 10 of FIG. 1.

Referring to FIGS. 1 and 2, the semiconductor package 10 may include the lower package LP1 and an upper package UP. The semiconductor package 10 may be of a package-on-package type, in which the upper package UP is stacked on or attached to the lower package LP1.

The lower package LP1 may include a first redistribution structure 110, a first semiconductor chip 120, a second semiconductor chip 130, a molding layer 151, and conductive posts 153. The lower package LP1 may have a fan-out structure. The footprint of the first redistribution structure 110 may be greater than the footprint of both the first and second semiconductor chips 120 and 130. The footprint of the first redistribution structure 110 may be the same as that of the semiconductor package 10.

The first redistribution structure 110 may correspond to a package substrate, on which electronic components, such as the first semiconductor chip 120 and the second semiconductor chip 130, are mounted. The first redistribution structure 110 may substantially have a plate shape or a panel shape. The first redistribution structure 110 may include a top surface and a bottom surface opposite to the top surface. The top and bottoms surfaces of the first redistribution structure 110 may be substantially flat. Hereinafter, a direction parallel with the top or bottom surface of the first redistribution structure 110 may be defined as a horizontal direction (e.g., the X direction and/or the Y direction), a direction perpendicular to the top or bottom surface of the first redistribution structure 110 may be defined as a vertical direction (e.g., the Z direction), and a length in the horizontal direction (e.g., the X direction and/or the Y direction) may be defined as a horizontal width.

The first redistribution structure 110 may include a plurality of first redistribution insulating layers 111 and a first conductive redistribution pattern 113.

The first redistribution insulating layers 111 may be stacked on each other in the vertical direction (e.g., the Z direction). The first redistribution insulating layers 111 may include an insulating polymer, epoxy, or a combination thereof. For example, the first redistribution insulating layers 111 may be formed from photo-imageable dielectric (PID) or photosensitive polyimide (PSPI)

The first conductive redistribution pattern 113 may include first conductive layers 1131, first conductive via patterns 1133, and external connection pads 1135. The first conductive layers 1131 may extend in the horizontal direction (e.g., the X direction and/or the Y direction) and may be at different vertical levels, thereby forming a multi-level structure. Each of the first conductive layers 1131 may be on either of the top and bottom surfaces of any one of the first redistribution insulating layers 111. Each of the first conductive layers 1131 may include a line pattern, which extends as a line along either of the top and bottom surfaces of any one of the first redistribution insulating layers 111. A first conductive layer 1131 on the uppermost one of the first redistribution insulating layers 111 may include a pad, to which a first chip connection bump 143 for electrical connection to the first semiconductor chip 120 is attached, a pad, to which a second chip connection bump 145 for electrical connection to the second semiconductor chip 130 is attached, and pads, to which the conductive posts 153 are attached. The first conductive via patterns 1133 may extend in the vertical direction (e.g., the Z direction) and pass through at least one of the first redistribution insulating layers 111. The first conductive via patterns 1133 may electrically connect the first conductive layers 1131 at different vertical levels to each other or electrically connect a first conductive layer 1131 to the external connection pads 1135. The external connection pads 1135 may be on the bottom surface of the first redistribution structure 110 and in contact with external connectors 141, respectively. The external connectors 141 may be electrically connected to the first semiconductor chip 120, the second semiconductor chip 130, and/or the conductive posts 153 through the first conductive redistribution pattern 113.

For example, the first conductive layers 1131, the first conductive via patterns 1133, and the external connection pads 1135 may include metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

At least some of the first conductive layers 1131 may be integrally formed together with some of the first conductive via patterns 1133. For example, some of the first conductive layers 1131 may be integrally formed together with first conductive via patterns 1133, which are below and in contact with some first conductive layers 1131. For example, a first conductive layer 1131 and a first conductive via pattern 1133, which are connected to each other, may be formed by an electroplating process.

In embodiments, each of the first conductive via patterns 1133 may have a tapered shape having a horizontal width decreasing from the top thereof toward the bottom thereof. The horizontal width of each of the first conductive via patterns 1133 may decrease toward the top surface of an external connection pad 1135.

A seed metal layer 115 may be between a first conductive layer 1131 and a first redistribution insulating layer 111 and between the first redistribution insulating layer 111 and a first conductive via pattern 1133. The seed metal layer 115 may also be between the first conductive via pattern 1133 and the external connection pads 1135. The seed metal layer 115 may be between the external connection pads 1135 and external connectors 141 and may extend along the bottom surface of the external connection pads 1135. For example, the seed metal layer 115 may include at least one selected from a group consisting of copper (Cu), titanium (Ti), titanium tungsten (TiW), titanium nitride (TiN), tantalum (Ta), tantalum nitride (TaN), chrome (Cr), and aluminum (Al). For example, the seed metal layer 115 may be formed by a physical vapor deposition (PVD) process, e.g., sputtering.

In embodiments, a cross-section of each of the external connection pads 1135 may have a rectangular shape. In embodiments, the bottom surface of the external connection pads 1135 may be coplanar with the bottom surface of the first redistribution insulating layer 111. For example, the external connection pads 1135 may be formed by an electroplating process. In embodiments, the external connection pads 1135 may include a plurality of metal layers, which are stacked in the vertical direction (e.g., the Z direction).

The external connectors 141 may be respectively attached to the external connection pads 1135 of the first redistribution structure 110. The external connectors 141 may be configured to electrically and physically connect the first redistribution structure 110 and an external device. For example, the external connectors 141 may be formed from solder balls or solder bumps.

The first redistribution structure 110 may include a first mounting region R1 and a second mounting region R2, which are spaced apart from each other. The first mounting region R1 and the second mounting region R2 may be provided in the top surface of the first redistribution structure 110 and may be spaced apart from each other in the horizontal direction (e.g., the X direction and/or the Y direction). The first semiconductor chip 120 may be on the first mounting region R1 of the first redistribution structure 110. The second semiconductor chip 130, the conductive posts 153, and the upper package UP may be on the second mounting region R2.

The first semiconductor chip 120 may be mounted on the first mounting region R1 of the first redistribution structure 110. The first semiconductor chip 120 may include a first semiconductor substrate 121 and first chip pads 123. The first semiconductor substrate 121 may include a top surface and a bottom surface opposite to the top surface. The bottom surface of the first semiconductor substrate 121 may correspond to the active surface thereof, and the top surface of the first semiconductor substrate 121 may correspond to the inactive surface thereof. The first semiconductor substrate 121 may be formed from a semiconductor wafer. For example, the first semiconductor substrate 121 may include silicon (Si). Alternatively, the first semiconductor substrate 121 may include a semiconductor element, e.g., germanium (Ge), or a compound semiconductor, such as silicon carbide (SiC), gallium arsenide (GaAs), indium arsenide (InAs), or indium phosphide (InP). The first semiconductor substrate 121 may include a conductive region, e.g., an impurity-doped well or an impurity-doped structure. A semiconductor device layer including individual devices may be on the active surface of the first semiconductor substrate 121. For example, the individual devices may include a transistor. The individual devices may include microelectronic devices, e.g., a metal-oxide-semiconductor field effect transistor (MOSFET), a system large scale integration (LSI), an image sensor like a CMOS image sensor (CIS), a micro-electro-mechanical system (MEMS), an active element, a passive element, and/or the like. The first chip pads 123 may be in the bottom surface of the first semiconductor chip 120 and may be electrically connected to individual devices of the semiconductor device layer. In example embodiments, bottom surfaces of the first chip pads 123 may be coplanar with the bottom surface of the first semiconductor substrate 121.

The first semiconductor chip 120 may be mounted on the first redistribution structure 110 in a flip chip manner. The first semiconductor chip 120 may be electrically and physically connected to the first conductive redistribution pattern 113 of the first redistribution structure 110 through first chip connection bumps 143. Each of the first chip connection bumps 143 may be between the first chip pads 123 of the first semiconductor chip 120 and the first conductive layer 1131 on the uppermost one of the first redistribution insulating layers 111. The first chip connection bumps 143 may include a solder bump. In embodiments, a top surface 129 of the first semiconductor chip 120 may be exposed outside the semiconductor package 10. For example, the top surface 129 of the first semiconductor chip 120 may be coplanar with a top surface 1511 of the molding layer 151. In embodiments, a heat sink may be attached to the top surface 129 of the first semiconductor chip 120. In example embodiments, the molding layer 151 may fill the gap between the first semiconductor chip 120 and the first redistribution structure 110 and may surround the side walls of the first chip connection bumps 143.

The second semiconductor chip 130 may be mounted on the second mounting region R2 of the first redistribution structure 110. The second semiconductor chip 130 may be electrically connected to the first semiconductor chip 120 through the first conductive redistribution pattern 113 of the first redistribution structure 110. The second semiconductor chip 130 may include a second semiconductor substrate 131 and second chip pads 133. The bottom surface of the second semiconductor substrate 131 may correspond to the active surface thereof, and the top surface of the second semiconductor substrate 131 may correspond to the inactive surface thereof. The material of the second semiconductor substrate 131 may be substantially the same as or similar to that of the first semiconductor substrate 121 of the first semiconductor chip 120. A semiconductor device layer including individual devices may be on the bottom surface of the second semiconductor substrate 131. The second chip pads 133 may be in the bottom surface of the second semiconductor chip 130 and may be electrically connected to individual devices of the semiconductor device layer of the second semiconductor chip 130.

The second semiconductor chip 130 may be mounted on the first redistribution structure 110 in a flip chip manner. The second semiconductor chip 130 may be electrically and physically connected to the first conductive redistribution pattern 113 of the first redistribution structure 110 through second chip connection bumps 145. Each of the second chip connection bumps 145 may be between the second chip pads 133 of the second semiconductor chip 130 and the first conductive layer 1131 on the uppermost one of the first redistribution insulating layers 111. The second chip connection bumps 145 may include a solder bump.

The molding layer 151 may be on the first redistribution structure 110 and mold the first semiconductor chip 120 and the second semiconductor chip 130. The molding layer 151 may cover the top surface of the first redistribution structure 110. The molding layer 151 may extend along and surround the side walls of the first semiconductor chip 120. For example, the molding layer 151 may contact the side walls of the first semiconductor chip 120. The molding layer 151 may not cover the top surface 129 of the first semiconductor chip 120. A top surface 1511 of the molding layer 151 may be coplanar with the top surface 129 of the first semiconductor chip 120. Furthermore, the molding layer 151 may fill the gap between the first semiconductor chip 120 and the first redistribution structure 110 and surround the side walls of the first chip connection bumps 143. The molding layer 151 may extend along and surround the side walls of the second semiconductor chip 130. For example, the molding layer 151 may contact the side walls of the second semiconductor chip 130. In embodiments, the molding layer 151 may not cover the top surface of the second semiconductor chip 130, and the top surface 1511 of the molding layer 151 may be coplanar with the top surface of the second semiconductor chip 130. In embodiments, the molding layer 151 may cover the top surface of the second semiconductor chip 130. Furthermore, the molding layer 151 may fill the gap between the second semiconductor chip 130 and the first redistribution structure 110 and surround the side walls of the second chip connection bumps 145.

For example, the molding layer 151 may include epoxy-group molding resin or polyimide-group molding resin. In embodiments, the molding layer 151 may include an epoxy molding compound.

The conductive posts 153 may be on the second mounting region R2 of the first redistribution structure 110. The conductive posts 153 may correspond to a vertical connection conductor for electrically connecting the first conductive redistribution pattern 113 of the first redistribution structure 110 to the upper package UP. The conductive posts 153 may pass through the molding layer 151 in the vertical direction (e.g., the Z direction). An upper portion of each of the conductive posts 153 may be in contact with an inter-package connector 161. In embodiments, the top surface of the conductive posts 153 may be coplanar with the top surface 1511 of the molding layer 151. A lower portion of the conductive posts 153 may be in contact with the first conductive layer 1131 on the uppermost one of the first redistribution insulating layers 111. For example, the conductive posts 153 may include copper (Cu).

The upper package UP may be mounted on the lower package LP1 through the inter-package connectors 161. The upper package UP may be above the first semiconductor chip 120 and the molding layer 151 The upper package UP may overlap with the second mounting region R2 of the first redistribution structure 110 but not with the first mounting region R1 of the first redistribution structure 110 in the vertical direction (e.g., the Z direction). For example, the upper package UP may cover the second semiconductor chip 130 but not the first semiconductor chip 120. The footprint of the upper package UP may be less than that of the lower package LP1 and greater than that of the second semiconductor chip 130. For example, the horizontal width of the upper package UP may be greater than that of the second semiconductor chip 130.

In embodiments, the upper package UP may include a mounting substrate 171, at least one third semiconductor chip 173, and a molding layer 179.

For example, the mounting substrate 171 may include a printed circuit board (PCB). The mounting substrate 171 may include a base insulating layer 1711, upper pads 1713 on the top surface of the base insulating layer 1711, and lower pads 1715 on the bottom surface of the base insulating layer 1711. In example embodiments, bottom surfaces of the lower pads 1715 may be coplanar with the bottom surface of the base insulating layer 1711, and top surfaces of the upper pads 1713 may be coplanar with the top surface of the base insulating layer 1711. The base insulating layer 1711 may include at least one material selected from a group consisting of phenol resin, epoxy resin, and polyimide. The upper pads 1713 and the lower pads 1715 may include a conductive material, such as copper or aluminum. The upper pads 1713 and the lower pads 1715 may be electrically connected to each other through an interconnect structure inside the base insulating layer 1711. The third semiconductor chip 173 may be mounted on the mounting substrate 171 through third chip connection bumps 175 respectively connected to third chip pads 1731. The third semiconductor chip 173 may be referred to as an upper semiconductor chip. The third chip connection bumps 175 may be respectively connected to the third chip pads 1731 of the third semiconductor chip 173 and respectively connected to upper pads 1713 of the mounting substrate 171. The molding layer 179 may be on the top surface of the mounting substrate 171 and may cover the third semiconductor chip 173. The molding layer 179 may include epoxy-group molding resin or polyimide-group molding resin. For example, the molding layer 179 may include an epoxy molding compound.

In some embodiments, the upper package UP may be omitted, and the third semiconductor chip 173 may be directly mounted on the lower package LP1 instead. In this case, the third semiconductor chip 173 may be directly mounted on the lower package LP1 through inter-package connectors 161 between the third chip pads 1731 and conductive posts 153. In this case, the top and side surfaces of the third semiconductor chip 173 may be exposed outside the semiconductor package 10.

The first to third semiconductor chips 120, 130, and 173 may include different kinds of semiconductor chips and may be electrically connected to each other through the first redistribution structure 110 and/or conductive posts 153. The first to third semiconductor chips 120, 130, and 173 may include a memory chip, a logic chip, a system-on-chip (SoC), a power management integrated circuit (PMIC) chip, a radio frequency IC (FRIC) chip, or the like. The memory chip may include a dynamic random access memory (DRAM) chip, a static RAM (SRAM) chip, a magnetic RAM (MRAM) chip, a NAND flash memory chip, and/or a high bandwidth memory (HBM) chip. The logic chip may include an application processor (AP), a microprocessor, a central processing unit (CPU), a controller, and/or an application specific IC (ASIC). For example, an SoC may include at least two circuits selected from a logic circuit, a memory circuit, a digital IC, an RFIC, and an input/output (I/O) circuit.

In embodiments, the first semiconductor chip 120 may generate more heat than the second semiconductor chip 130 and/or the third semiconductor chip 173. In embodiments, the first semiconductor chip 120 may include a logic chip and/or an SoC. The top surface 129 of the first semiconductor chip 120 may be exposed outside the semiconductor package 10 by the top surface 1511 of the molding layer 151, and no electronic components may be arranged on the first semiconductor chip 120. Accordingly, the heat dissipation characteristic of the first semiconductor chip 120 may be improved, and an event in which electronic components around the first semiconductor chip 120 are degraded by heat generated by the first semiconductor chip 120 may be prevented.

In embodiments, each of the second semiconductor chip 130 and the third semiconductor chip 173 may correspond to a memory chip, a logic chip, an SoC, a PMIC chip, or an RFIC chip. In embodiments, the second semiconductor chip 130 may be a dummy chip and may not be electrically connected to another semiconductor chip (e.g., the first semiconductor chip 120 and/or the third semiconductor chip 173). In embodiments, when the first semiconductor chip 120 is a logic chip, the third semiconductor chip 173 may be a memory chip.

The semiconductor package 10 may include the external connectors 141 attached to the bottom surface of the first redistribution structure 110. The external connectors 141 may be attached to the external connection pads 1135 of the first redistribution structure 110. The external connectors 141 may electrically connect the semiconductor package 10 to an external device. For example, the external connectors 141 may include a solder ball or a solder bump. Signals (e.g., data signals, control signals, power signals, and/or ground signals) from an external device may be provided to the first semiconductor chip 120 or the second semiconductor chip 130 through a signal transmission path sequentially passing through external connectors 141 and the first conductive redistribution pattern 113. Signals output from the first semiconductor chip 120 or the second semiconductor chip 130 may be provided to an external device through a signal transmission path sequentially passing through the first conductive redistribution pattern 113 and the external connectors 141. Signals (e.g., data signals, control signals, power signals, and/or ground signals) from an external device may be provided to the third semiconductor chip 173 through a signal transmission path passing through the external connectors 141, the first conductive redistribution pattern 113, and the conductive posts 153. Signals output from the third semiconductor chip 173 may be provided to the first semiconductor chip 120 or the second semiconductor chip 130 through a signal transmission path passing through the conductive posts 153 and the first conductive redistribution pattern 113 or to an external device through another signal transmission path sequentially passing through the conductive posts 153, the first conductive redistribution pattern 113, and the external connectors 141.

According to embodiments, the first semiconductor chip 120 generating more heat than the second semiconductor chip 130 in the lower package LP1 is arranged in the first mounting region R1 of the first redistribution structure 110, and the upper package UP is arranged above the second mounting region R2 of the first redistribution structure 110 not to cover the first semiconductor chip 120, and accordingly, the semiconductor package 10 having an improved heat dissipation characteristic may be provided.

FIGS. 3A to 3G are cross-sectional views of stages in a method of manufacturing a semiconductor package, according to example embodiments. A method of manufacturing the semiconductor package 10 described with reference to FIGS. 1 and 2 is described below with reference to FIGS. 3A to 3G.

Figure 3A:
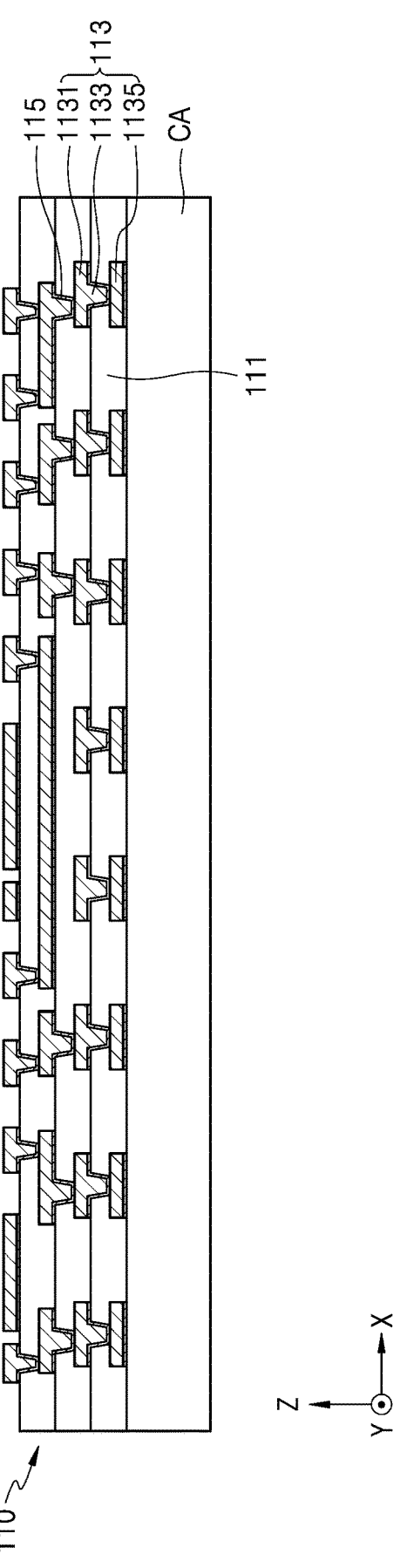
FIGS. 3A to 3G are cross-sectional views of stages in a method of manufacturing a semiconductor package, according to example embodiments.

Referring to FIG. 3A, the first redistribution structure 110 may be formed on a carrier substrate CA. The first redistribution structure 110 may include the first redistribution insulating layers 111, which are sequentially stacked on the carrier substrate CA, and the first conductive redistribution pattern 113 respectively insulated by the first redistribution insulating layers 111. The first conductive redistribution pattern 113 may include external connection pads 1135 extending along the top surface of the carrier substrate CA, a first conductive layer 1131 extending along the top surface of each of the first redistribution insulating layers 111, and a conductive via pattern 1133 extending through one of the first redistribution insulating layers 111.

To form the first redistribution structure 110, the external connection pads 1135 may be first formed on the carrier substrate CA. The external connection pads 1135 may be formed by a plating process. For example, the external connection pads 1135 may be formed by forming a seed metal layer 115 on the carrier substrate CA and then performing a plating process using the seed metal layer 115. After the external connection pads 1135 are formed, a first operation of forming an insulating film, which covers the external connection pads 1135 and has via holes, may be performed, and then a second operation of forming the first conductive via pattern 1133 filling the via holes of the insulating film and the first conductive layer 1131 extending along the top surface of the insulating film may be performed. The second operation of forming the first conductive via pattern 1133 and the first conductive layer 1131 may include a plating process using the seed metal layer 115. Thereafter, the first operation of forming the insulating film and the second operation of forming the first conductive layer 1131 may be repeated multiple times, thereby forming the first redistribution structure 110 having a multi-layer interconnect structure.

Figure 3B:
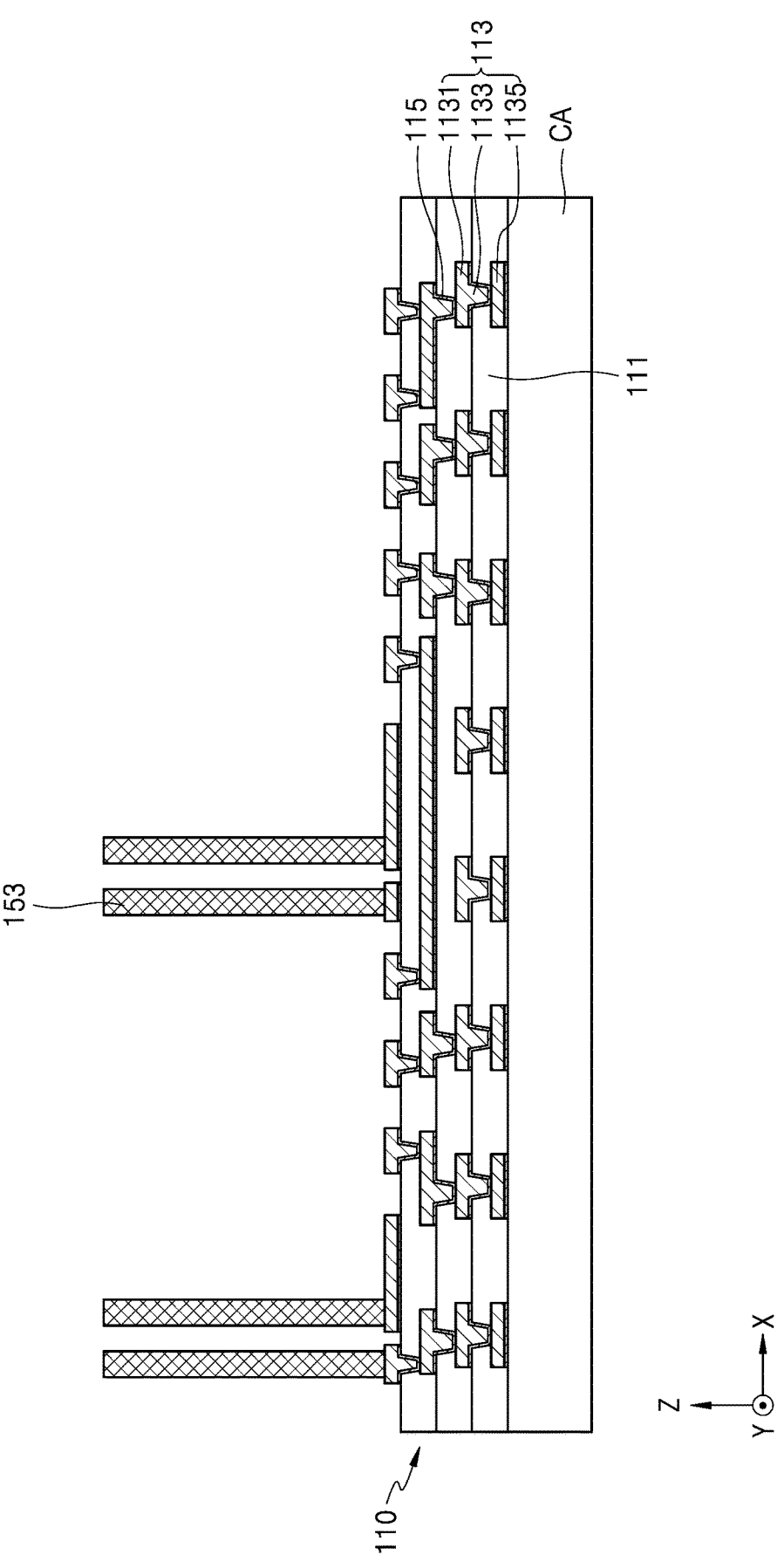

Referring to FIG. 3B, the conductive posts 153 may be formed on the first redistribution structure 110. For example, the conductive posts 153 may be formed by forming, on the first redistribution structure 110, a sacrificial layer having a through hole and filling the through hole of the sacrificial layer with a conductive material. Thereafter, the sacrificial layer may be removed.

Figure 3C:
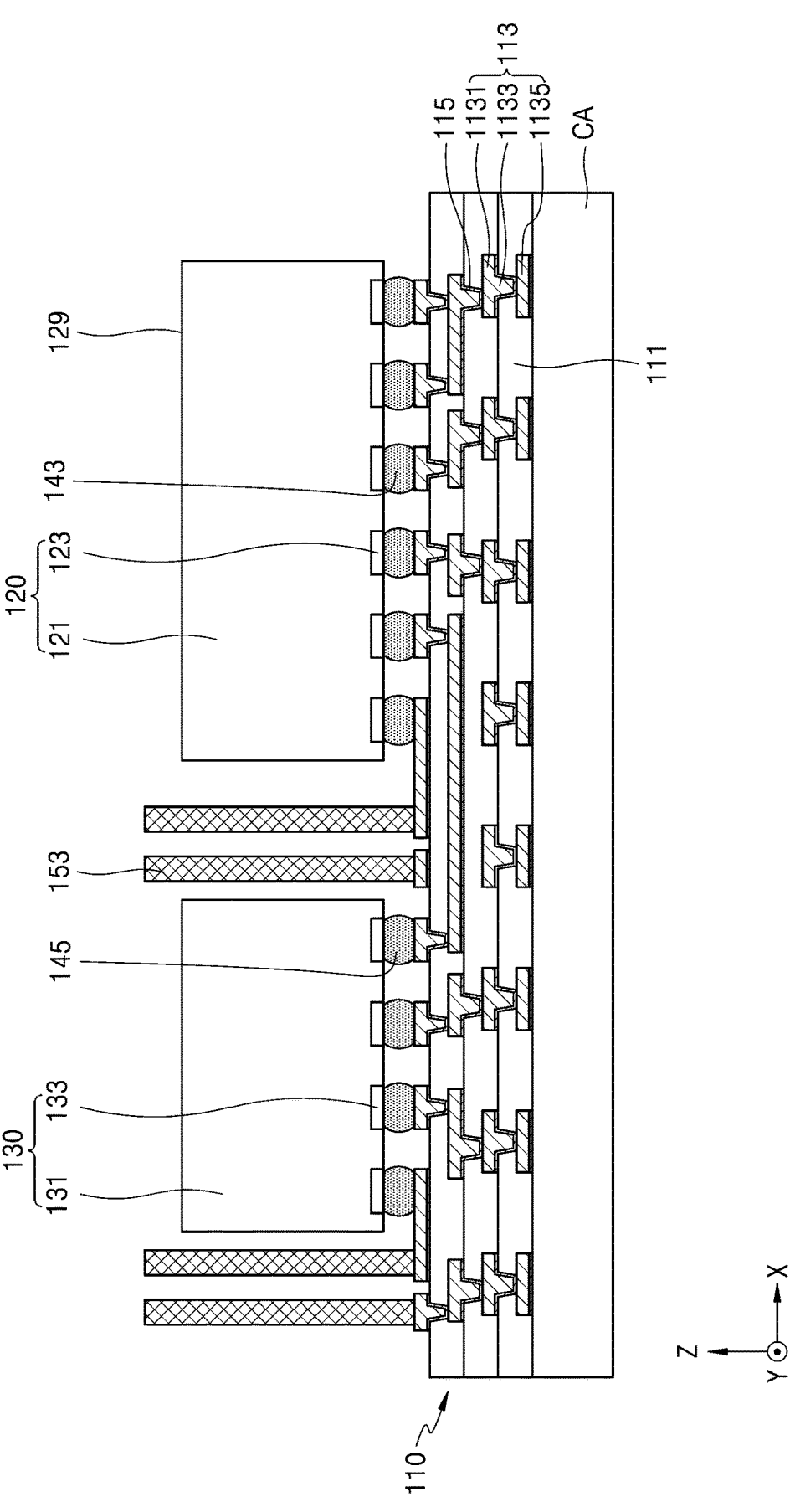

Referring to FIG. 3C, the first semiconductor chip 120 and the second semiconductor chip 130 may be mounted on the first redistribution structure 110. For example, the first semiconductor chip 120 and the second semiconductor chip 130 may be mounted on the first redistribution structure 110 in a flip chip manner. For example, the first semiconductor chip 120 may be mounted on the first redistribution structure 110 with the first chip connection bumps 143 provided between the first chip pads 123 and uppermost first conductive layer 1131, and the second semiconductor chip 130 may be mounted on the first redistribution structure 110 with the second chip connection bumps 145 provided between the second chip pads 133 and uppermost first conductive layer 1131.

Figure 3D:
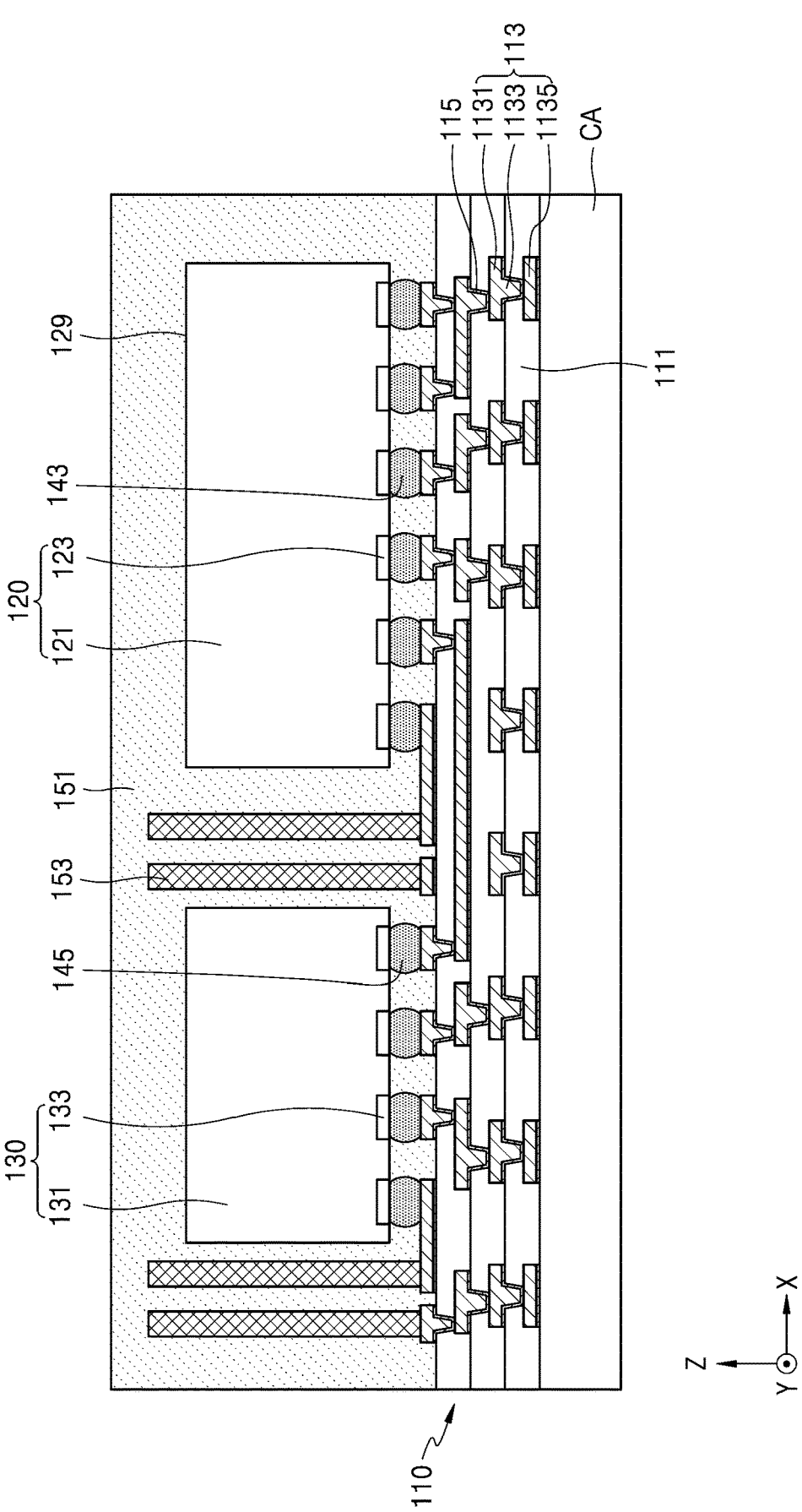

Referring to FIG. 3D, the molding layer 151 may be formed on the first redistribution structure 110 and may cover the first semiconductor chip 120, the second semiconductor chip 130, and the conductive posts 153. The molding layer 151 may surround and contact side walls of the first semiconductor chip 120 and the second semiconductor chip 130 and side surfaces of the conductive posts 153, the first chip connection bumps 143, and the second chip connection bumps 145. The molding layer 151 may be formed by supplying a molding material in a liquid phase over the carrier substrate CA and then hardening the molding material.

Figure 3E:
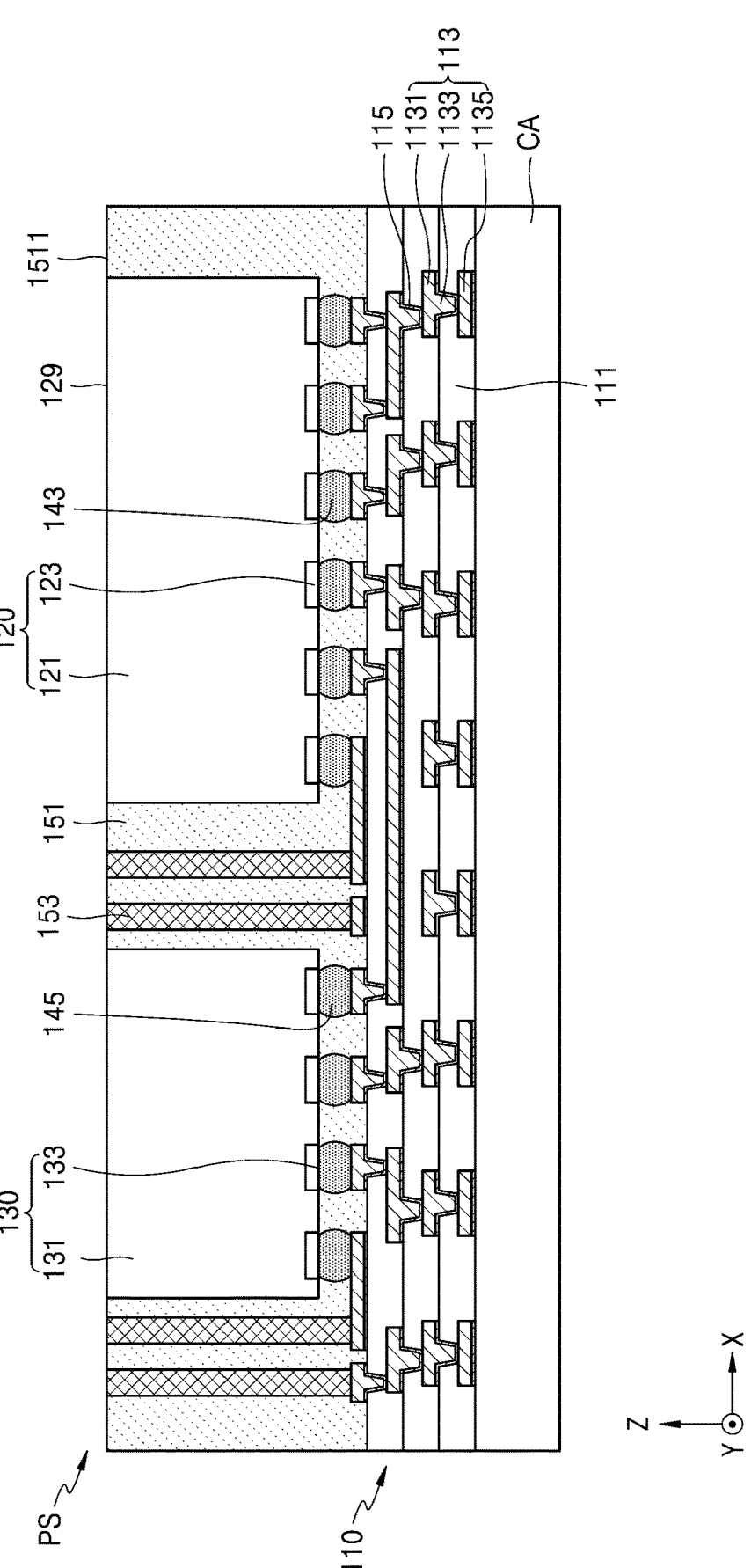

Referring to FIG. 3E, the molding layer 151 may be partially removed to expose the first semiconductor chip 120, the second semiconductor chip 130, and the conductive posts 153. The molding layer 151 may be partially removed by a chemical mechanical polishing (CMP) process, a grinding process, or the like. For example, a portion of the molding layer 151 and a portion of the first semiconductor chip 120 may be removed by a polishing process. In embodiments, as a result of the polishing process, the top surface 1511 of the molding layer 151 may be coplanar with the top surface 129 of the first semiconductor chip 120, the top surface of the second semiconductor chip 130, and the top surfaces of the conductive posts 153. The first redistribution structure 110, the first semiconductor chip 120, the second semiconductor chip 130, the conductive posts 153, and the molding layer 151 may form a package structure PS having a panel shape (e.g., a rectangular shape).

Figure 3F:
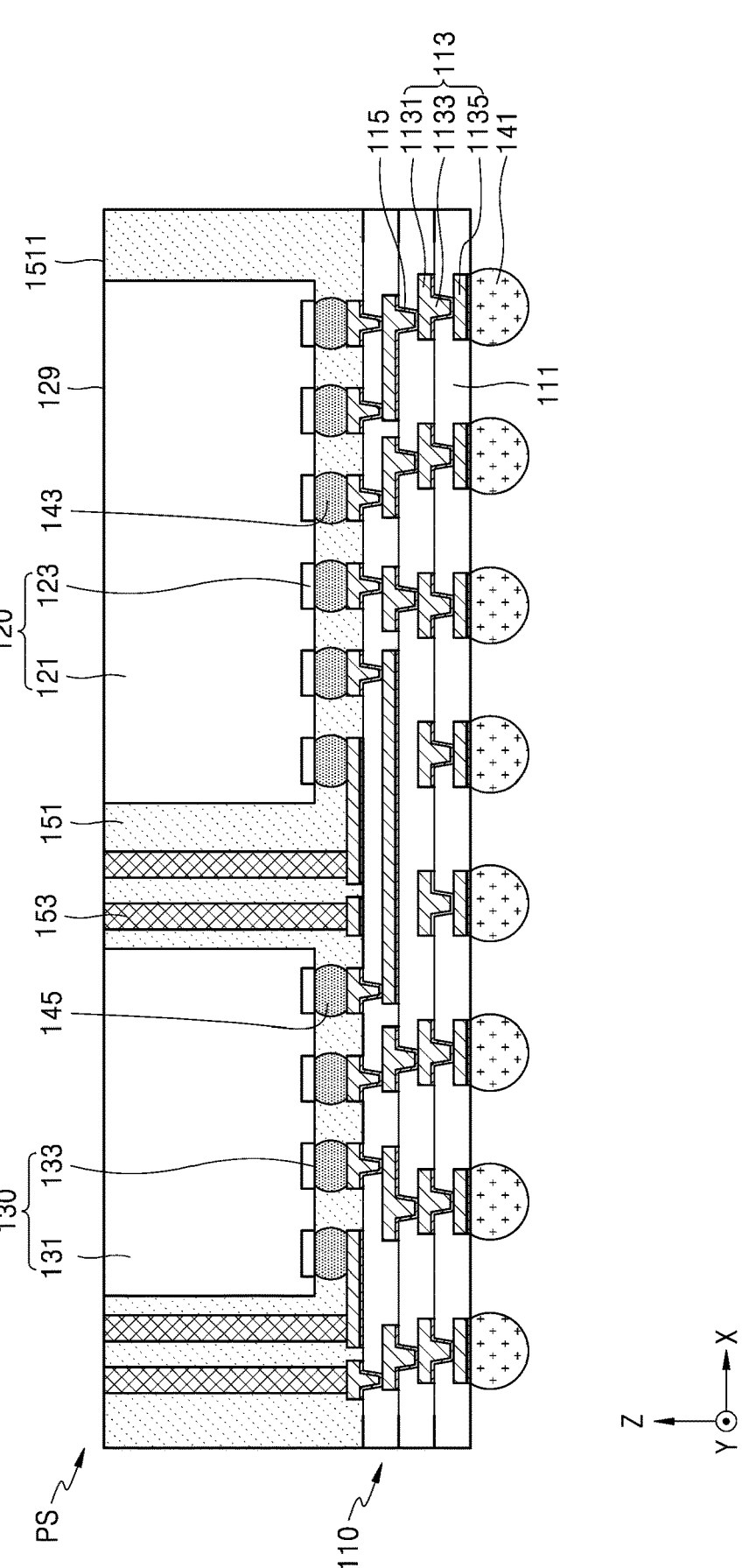

Referring to FIGS. 3E and 3F, the carrier substrate CA may be removed from the first redistribution structure 110. Thereafter, the external connectors 141 may be attached to the external connection pads 1135 of the first redistribution structure 110.

Figure 3G:
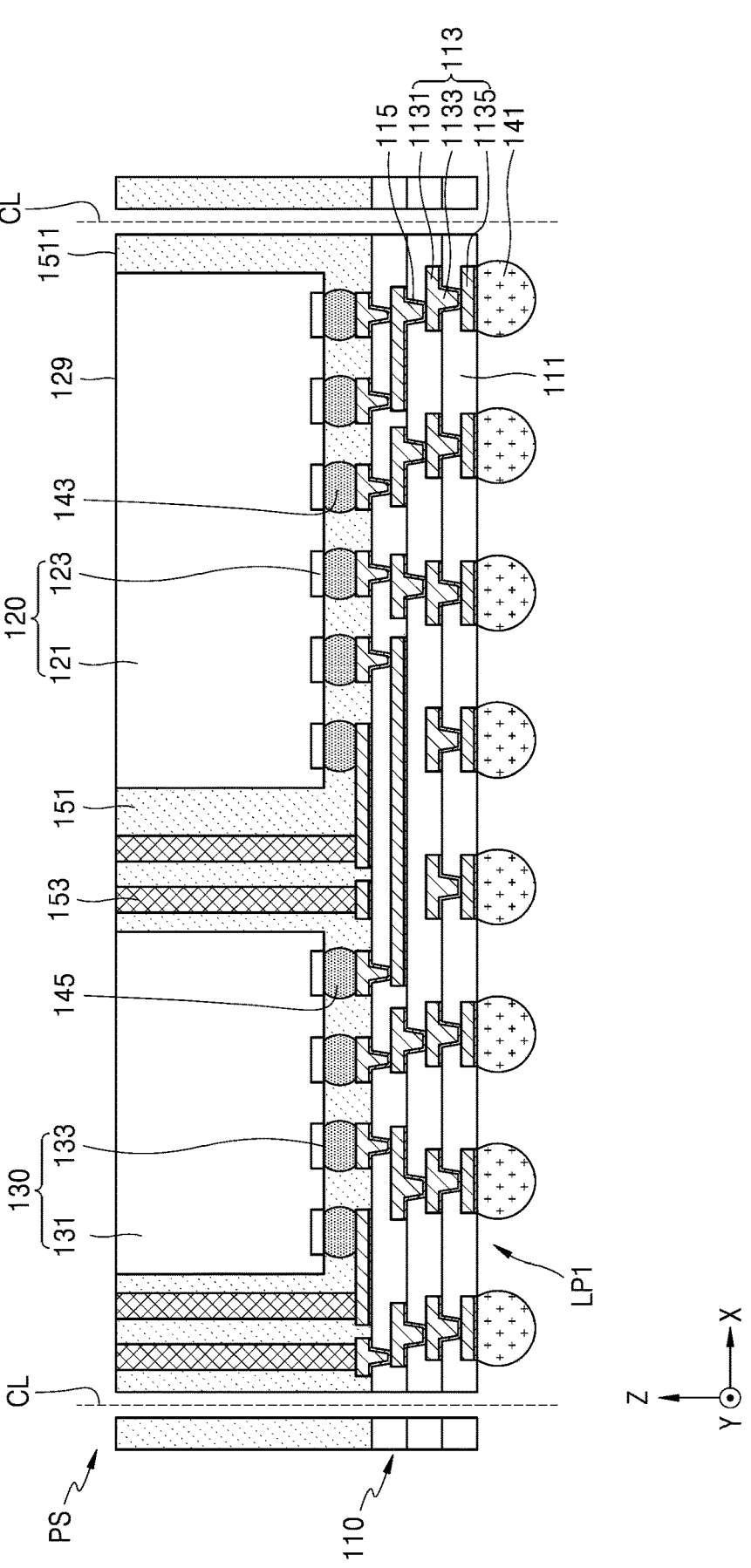

Referring to FIG. 3G, the package structure PS may be cut along a cutting line CL. Through the cutting process performed on the package structure PS, the package structure PS may be divided into a plurality of lower packages LP1. Although not illustrated, each of the lower packages LP1 may have the same elements and the same structure.

Subsequently, referring to FIG. 1, the upper package UP may be attached to any one of the lower packages LP1 individually separated from each other. The upper package UP may be attached to a lower package LP1 through inter-package connectors 161.

Figure 4:
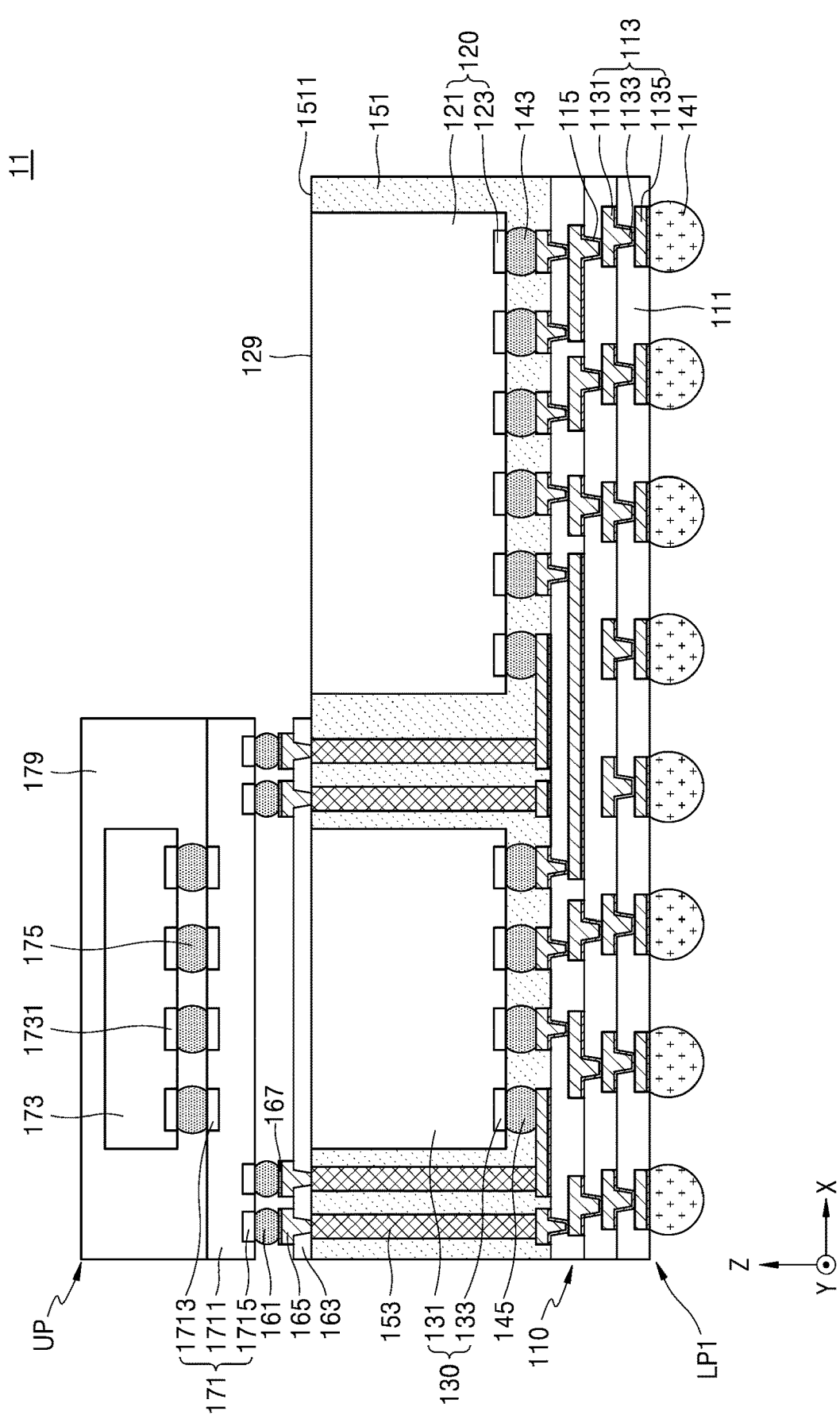
FIG. 4 is a cross-sectional view of a semiconductor package, according to example embodiments.

FIG. 4 is a cross-sectional view of a semiconductor package 11 according to example embodiments. The semiconductor package 11 of FIG. 4 is described below, focusing on differences from the semiconductor package 10 described with reference to FIGS. 1 and 2.

Referring to FIG. 4, the semiconductor package 11 may further include a cover insulating layer 163 and a conductive bump structure 165.

The cover insulating layer 163 may partially cover the top surface of the lower package LP1. The cover insulating layer 163 may vertically overlap with the second mounting region R2 of the first redistribution structure 110. The cover insulating layer 163 may cover the top surface of the second semiconductor chip 130 and a portion of the top surface 1511 of the molding layer 151, which vertically overlaps with the second mounting region R2 of the first redistribution structure 110. The cover insulating layer 163 may not cover the top surface 129 of the first semiconductor chip 120 such that the top surface 129 of the first semiconductor chip 120 is exposed outside the semiconductor package 11.

The cover insulating layer 163 may include an insulating polymer, epoxy, or a combination thereof. For example, the cover insulating layer 163 may be formed from PID or PSPI. In embodiments, the material of the cover insulating layer 163 may be the same as that of the first redistribution insulating layers 111.

The conductive bump structure 165 may be between the conductive posts 153 and the inter-package connectors 161. The conductive bump structure 165 may electrically connect the conductive posts 153 to the inter-package connectors 161. The conductive bump structure 165 may include a lower portion, which fills a through hole of the cover insulating layer 163, and an upper portion, which protrudes from the cover insulating layer 163. The lower portion of the conductive bump structure 165 may be in contact with the top surfaces of the conductive posts 153, and the upper portion of the conductive bump structure 165 may be in contact with the inter-package connectors 161. For example, the conductive bump structure 165 may include copper (Cu).

In embodiments, a conductive adhesive layer 167 may be between the conductive bump structure 165 and the inter-package connectors 161. The conductive adhesive layer 167 may contact the inter-package connectors 161. For example, the conductive adhesive layer 167 may be configured to strengthen the physical connectivity between the conductive bump structure 165 and the inter-package connectors 161. For example, the conductive adhesive layer 167 may include a plurality of metal layers stacked on the top surface of the conductive bump structure 165. For example, the conductive adhesive layer 167 may include a first metal layer and a second metal layer, which are stacked on the top surface of the conductive bump structure 165. For example, the first metal layer of the conductive adhesive layer 167 may include nickel (Ni), and the second metal layer of the conductive adhesive layer 167 may include gold (Au).

Figure 5A:
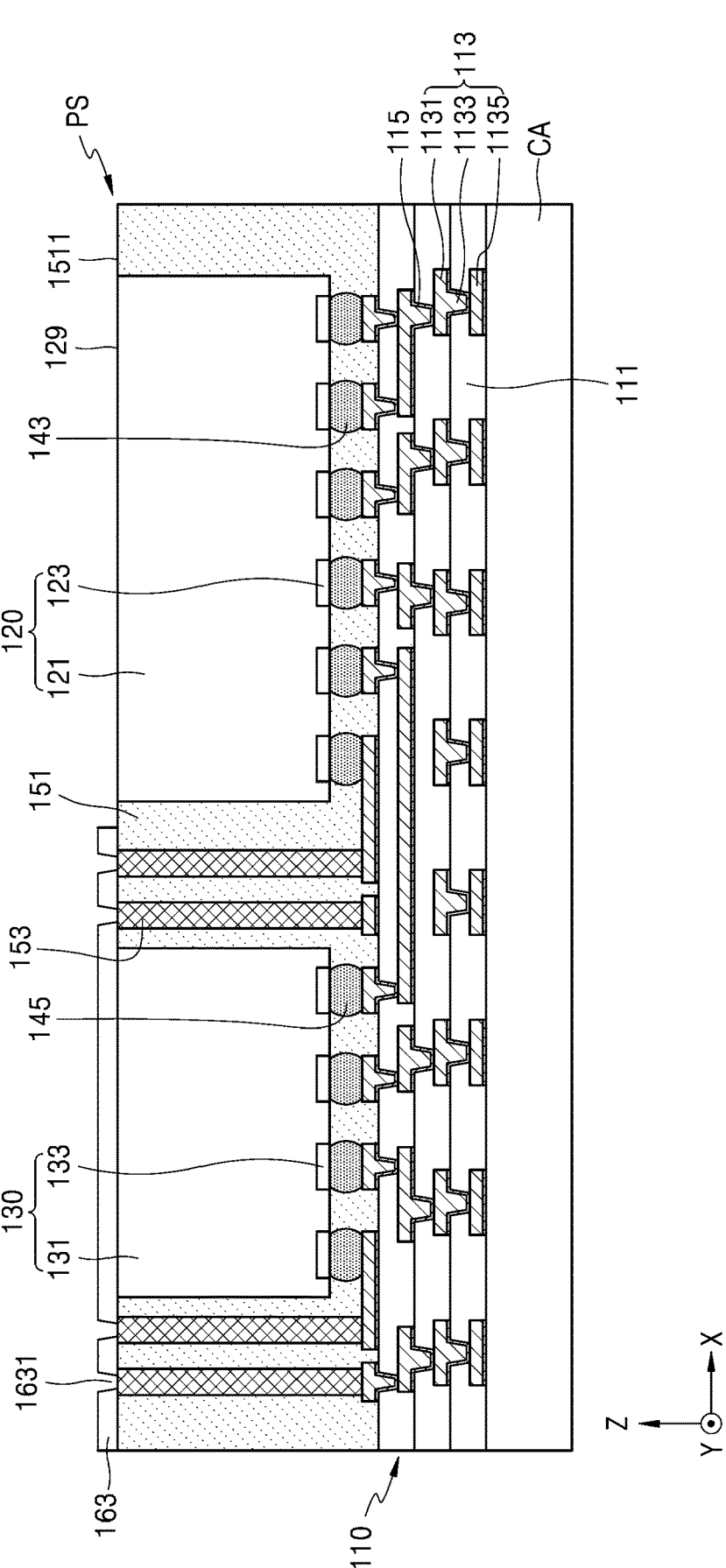
FIGS. 5A and 5B are cross-sectional views of stages in a method of manufacturing a semiconductor package, according to example embodiments.
Figure 5B:
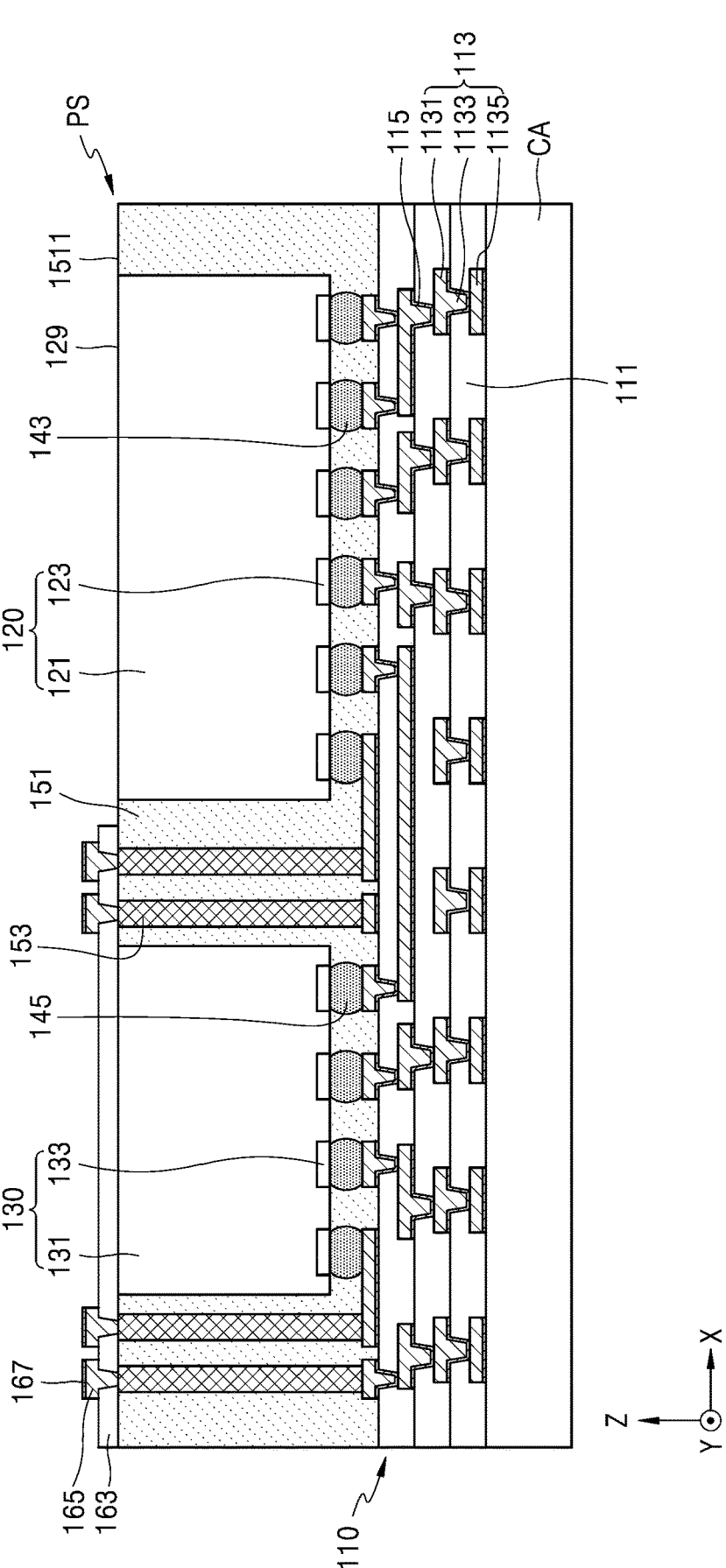

FIGS. 5A and 5B are cross-sectional views of stages in a method of manufacturing a semiconductor package, according to example embodiments. A method of manufacturing the semiconductor package 11 described with reference to FIG. 4 is described below with reference to FIGS. 5A and 5B, and redundant descriptions give above are omitted or made brief.

Referring to FIG. 5A, after the package structure PS is formed by a method that is substantially the same as that described with reference to FIGS. 3A to 3E, the cover insulating layer 163 partially covering the top surface of the package structure PS may be formed. The cover insulating layer 163 may cover the first semiconductor chip 120 and a portion of the molding layer 151 around the first semiconductor chip 120. The cover insulating layer 163 may include through holes 1631, which at least partially exposes the top surfaces of the conductive posts 153. To form the cover insulating layer 163, an insulating film covering the top surface of the package structure PS may be formed, and then a patterning process may be performed on the insulating film.

Referring to FIG. 5B, after the cover insulating layer 163 is formed, the conductive bump structure 165 contacting the top surface of the conductive posts 153 through the through holes 1631 of the cover insulating layer 163 may be formed. The conductive bump structure 165 may be formed by forming a resist film, which has holes in communication with the through holes 1631 of the cover insulating layer 163, on the cover insulating layer 163 and filling the hole of the resist film with a conductive material by performing a plating process. In example embodiments, the conductive adhesive layer 167 may be formed on the conductive bump structure 165.

Referring to FIGS. 4 and 5B, after the conductive bump structure 165 and the conductive adhesive layer 167 are formed, the carrier substrate CA may be removed from the first redistribution structure 110, the external connectors 141 may be attached to the external connection pads 1135 of the first redistribution structure 110, the package structure PS may be cut into a plurality of lower packages LP1 by performing a cutting process on the package structure PS, and the upper package UP may be arranged on the conductive bump structure 165.

Figure 6:
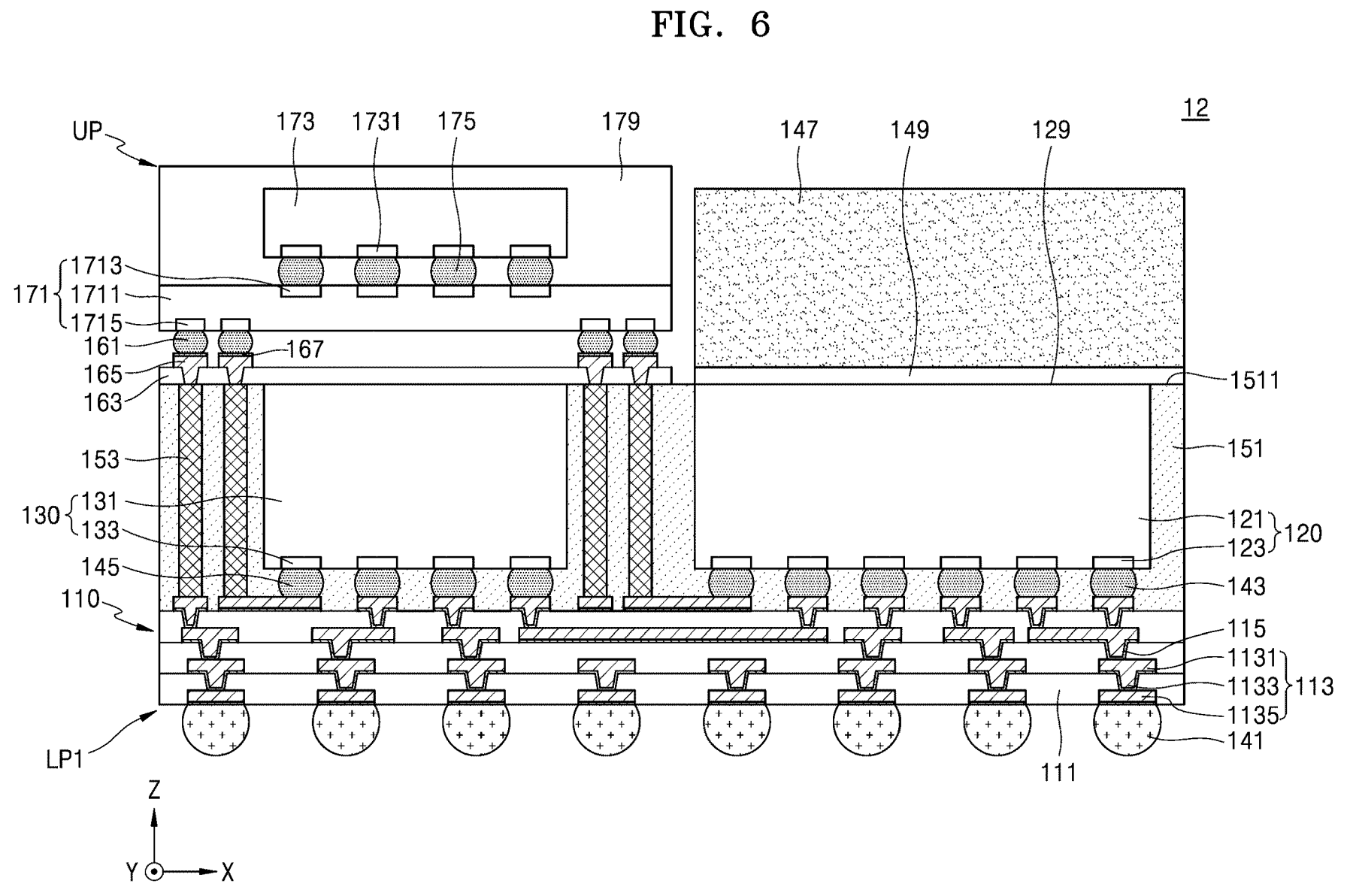

FIG. 6 is a cross-sectional view of a semiconductor package 12 according to example embodiments. The semiconductor package 12 of FIG. 6 is described below, focusing on differences from the semiconductor package 10 described with reference to FIGS. 1 and 2.

Referring to FIG. 6, the semiconductor package 12 may further include a heat dissipation plate 147 on the first semiconductor chip 120. The heat dissipation plate 147 may be on the first semiconductor chip 120 and/or the molding layer 151 to overlap with the first mounting region R1 of the first redistribution structure 110 and may be spaced apart from the upper package UP in a lateral direction parallel with the top surface 1511 of the molding layer 151.

The heat dissipation plate 147 may at least partially cover the top surface 129 of the first semiconductor chip 120. The heat dissipation plate 147 may be configured to emit heat, which is generated by the first semiconductor chip 120, to the outside. The heat dissipation plate 147 may include a thermal conductive material having a high thermal conductivity. For example, the heat dissipation plate 147 may include metal, such as copper (Cu) or aluminum (Al), or a carbon-containing material, such as graphene, graphite, and/or a carbon nanotube. The heat dissipation plate 147 may include a heat sink, a heat pipe, and/or a heat slug.

The heat dissipation plate 147 may be attached to the top surface 129 of the first semiconductor chip 120 through a thermal conductive adhesive layer 149. The thermal conductive adhesive layer 149 may include a material, which is thermally conductive and electrically insulative. The thermal conductive adhesive layer 149 may include a thermal interface material, a polymer including metal powder, thermal grease, or a combination thereof.

Figure 7:
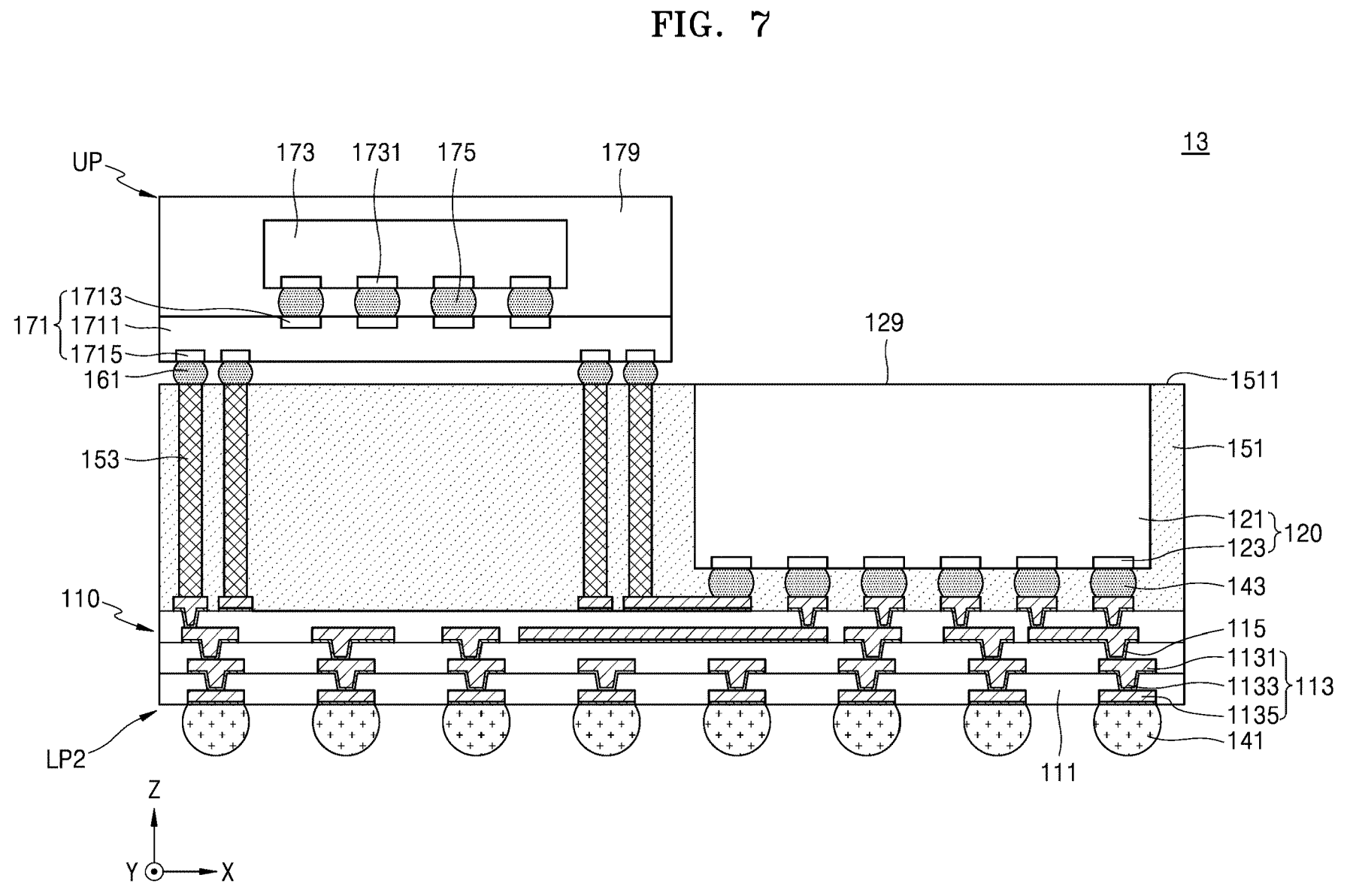

FIG. 7 is a cross-sectional view of a semiconductor package 13 according to example embodiments. The semiconductor package 13 of FIG. 7 is described below, focusing on differences from the semiconductor package 10 described with reference to FIGS. 1 and 2.

Referring to FIG. 7, a semiconductor chip may not be arranged in the second mounting region (e.g., second mounting region R2 of FIG. 2) of the first redistribution structure 110 of a lower package LP2. Because no semiconductor chip is arranged in the second mounting region R2 of the first redistribution structure 110, the characteristics of electronic components included in the upper package UP may be prevented from degrading due to heat generation by a semiconductor chip mounted on the second mounting region R2 of the first redistribution structure 110.

Figure 8:
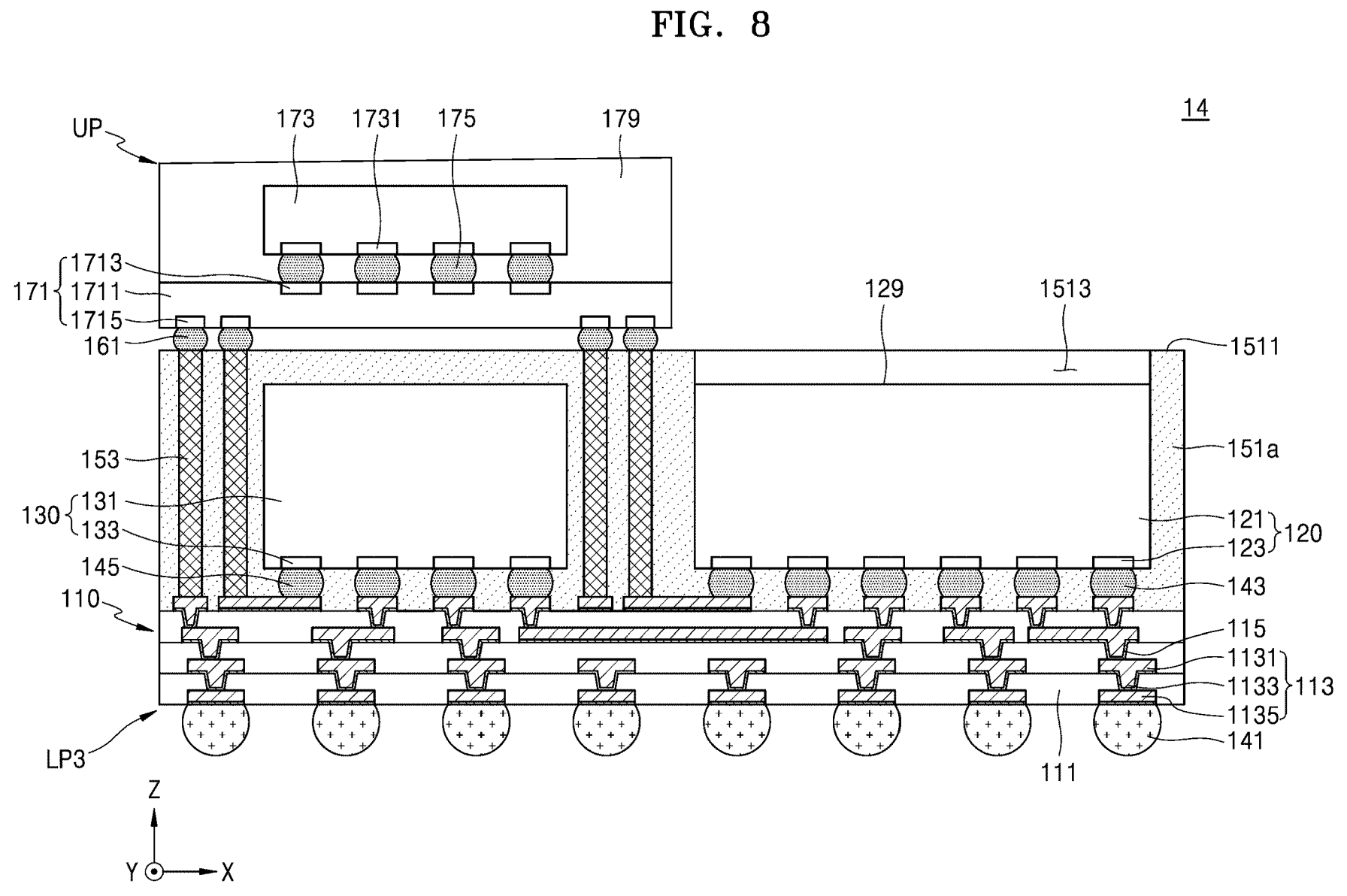

FIG. 8 is a cross-sectional view of a semiconductor package 14 according to example embodiments. The semiconductor package 14 of FIG. 8 is described below, focusing on differences from the semiconductor package 10 described with reference to FIGS. 1 and 2.

Referring to FIG. 8, a molding layer 151a of a lower package LP3 may include a groove 1513, which exposes the top surface 129 of the first semiconductor chip 120. The top surface 1511 of the molding layer 151a may be at a higher level than the top surface 129 of the first semiconductor chip 120, and the groove 1513 of the molding layer 151a may extend from the top surface 1511 of the molding layer 151a to the top surface 129 of the first semiconductor chip 120. The groove 1513 of the molding layer 151a may entirely or partially expose the top surface 129 of the first semiconductor chip 120.

Figure 9:
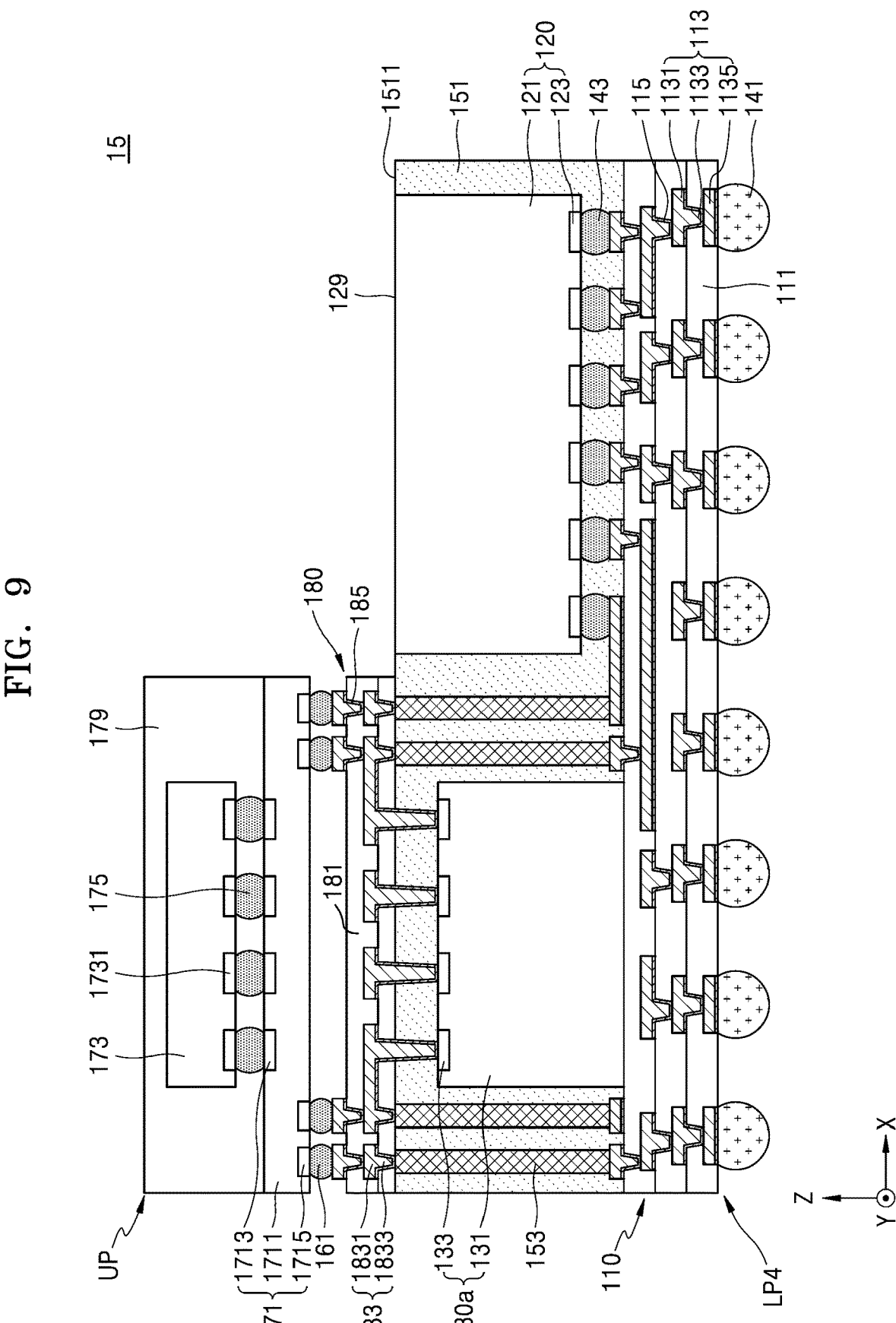
FIG. 9 is a cross-sectional view of a semiconductor package, according to example embodiments.

FIG. 9 is a cross-sectional view of a semiconductor package 15 according to example embodiments. The semiconductor package 15 of FIG. 9 is described below, focusing on differences from the semiconductor package 10 described with reference to FIGS. 1 and 2.

Referring to FIG. 9, a second semiconductor chip 130a of a lower package LP4 may be mounted on the first redistribution structure 110 in a face-up manner. The bottom surface of the second semiconductor substrate 131 may correspond to the inactive surface thereof, and the top surface of the second semiconductor substrate 131 may correspond to the active surface thereof. A semiconductor device layer of the second semiconductor chip 130a may be on the top surface of the second semiconductor substrate 131, and the second chip pads 133 may be in the top surface of the second semiconductor chip 130a. The top surface of the second semiconductor chip 130a may be at a lower vertical level than a top surface 1511 of the molding layer 151 and a top surface 129 of the first semiconductor chip 120.

The semiconductor package 15 may further include a second redistribution structure 180 between the lower package LP4 and the upper package UP. The second redistribution structure 180 may be on the lower package LP4 and may not cover the first semiconductor chip 120. The footprint of the second redistribution structure 180 may be less than that of the lower package LP4. The second redistribution structure 180 may vertically overlap with the second mounting region R2 of the first redistribution structure 110 but not with the first mounting region R1 of the first redistribution structure 110. The second redistribution structure 180 may provide an electrical connection path for electrically connecting the conductive posts 153 to the upper package UP and an electrical connection path for electrically connecting the second semiconductor chip 130a to the first redistribution structure 110.

The second redistribution structure 180 may include a plurality of second redistribution insulating layers 181 and a second conductive redistribution pattern 183.

The second redistribution insulating layers 181 may be stacked on each other in the vertical direction (e.g., the Z direction). The second redistribution insulating layers 181 may include an insulating polymer, epoxy, or a combination thereof. For example, the second redistribution insulating layers 181 may be formed from PID or PSPI.

The second conductive redistribution pattern 183 may include second conductive layers 1831 and second conductive via patterns 1833. Each of the second conductive layers 1831 may be on either of the top and bottom surfaces of any one of the second redistribution insulating layers 181. The second conductive layers 1831 may be at different vertical levels from each other, thereby forming a multi-level structure. For example, each of the second conductive layers 1831 may include a line pattern, which extends as a line along the top surface of any one of the second redistribution insulating layers 181. A second conductive layer 1831 on the uppermost one of the second redistribution insulating layers 181 may include pads, to which the inter-package connectors 161 are attached. The second conductive via patterns 1833 may extend in the vertical direction (e.g., the Z direction) and pass through at least one of the second redistribution insulating layers 181. The second conductive via patterns 1833 may electrically connect the second conductive layers 1831 at different vertical levels to each other or electrically connect a second conductive layer 1831 to the conductive posts 153. Each of some of the second conductive via patterns 1833 may electrically connect the second chip pads 133 of the second semiconductor chip 130a to the second conductive layer 1831. Some of the second conductive via patterns 1833 may pass through the molding layer 151 to be respectively connected to second chip pads 133 of the second semiconductor chip 130a. For example, the second conductive layer 1831 and the second conductive via patterns 1833 may include metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof.

At least some of the second conductive layers 1831 may be integrally formed together with some of the second conductive via patterns 1833. For example, some of the second conductive layers 1831 may be integrally formed together with second conductive via patterns 1833, which are below and in contact with some second conductive layers 1831. For example, a second conductive layer 1831 and a second conductive via pattern 1833, which are connected to each other, may be formed by an electroplating process. A seed metal layer 185 may be between the second conductive layer 1831 and a second redistribution insulating layer 181 and between the second redistribution insulating layer 181 and the second conductive via pattern 1833. For example, the seed metal layer 185 may include at least one selected from a group consisting of copper (Cu), titanium (Ti), titanium tungsten (TiW), titanium nitride (TiN), tantalum (Ta), tantalum nitride (TaN), chrome (Cr), and aluminum (Al).

In embodiments, each of the second conductive via patterns 1833 may have a tapered shape having a horizontal width decreasing from the top thereof toward the bottom thereof. In other words, the horizontal width of each of the second conductive via patterns 1833 may decrease toward the first redistribution structure 110.

Figure 10:
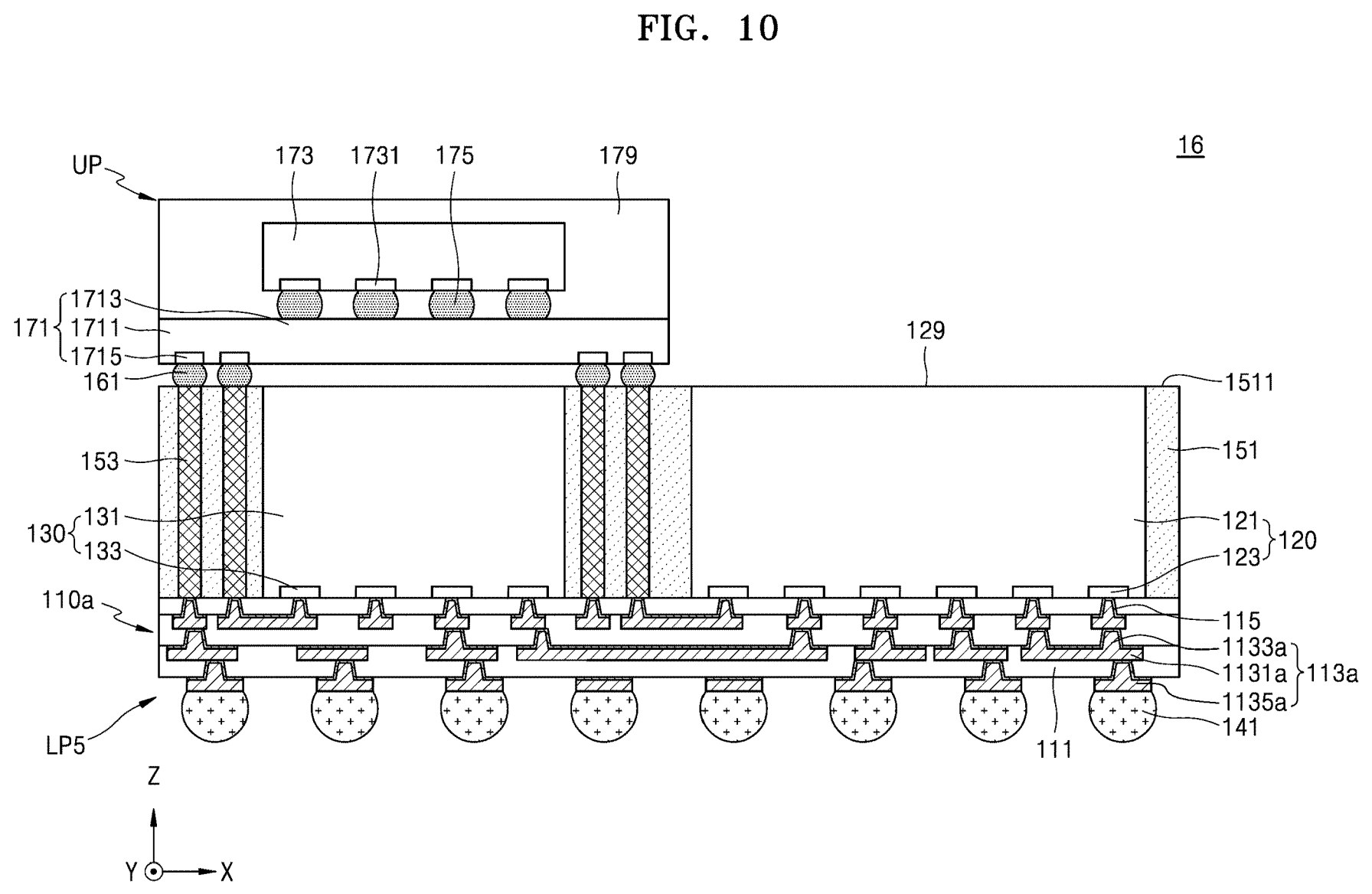

FIG. 10 is a cross-sectional view of a semiconductor package 16 according to example embodiments. The semiconductor package 16 of FIG. 10 is described below, focusing on differences from the semiconductor package 10 described with reference to FIGS. 1 and 2.

Referring to FIG. 10, the first and second semiconductor chips 120 and 130 of a lower package LP5 may be directly connected to a first redistribution structure 110*a*.

A first conductive redistribution pattern 113*a* of the first redistribution structure 110*a* may include first conductive layers 1131*a*, first conductive via patterns 1133*a*, and external connection pads 1135*a*. Each of the first conductive layers 1131*a* may include a line pattern, which extends along the bottom surface of any one of the first redistribution insulating layers 111. The first conductive via patterns 1133*a* may electrically connect the first conductive layers 1131*a* at different vertical levels to each other, electrically connect a first conductive layer 1131*a* to the first chip pads 123 of the first semiconductor chip 120, or electrically connect a first conductive layer 1131*a* to second chip pads 133 of the second semiconductor chip 130. Each of the external connection pads 1135*a* may protrude downward from the bottom surface of the lowest one of the first redistribution insulating layers 111. Some of the external connection pads 1135*a* may include a portion, which extends along the bottom surface of the lowest one of the first redistribution insulating layers 111, and a portion, which extends through the lowest one of the first redistribution insulating layers 111.

In embodiments, each of the first conductive via patterns 1133*a* may have a tapered shape having a horizontal width decreasing from the bottom thereof toward the top thereof. In other words, the horizontal width of each of the first conductive via patterns 1133*a* may decrease toward the first or second semiconductor chip 120 or 130.

Figure 11:
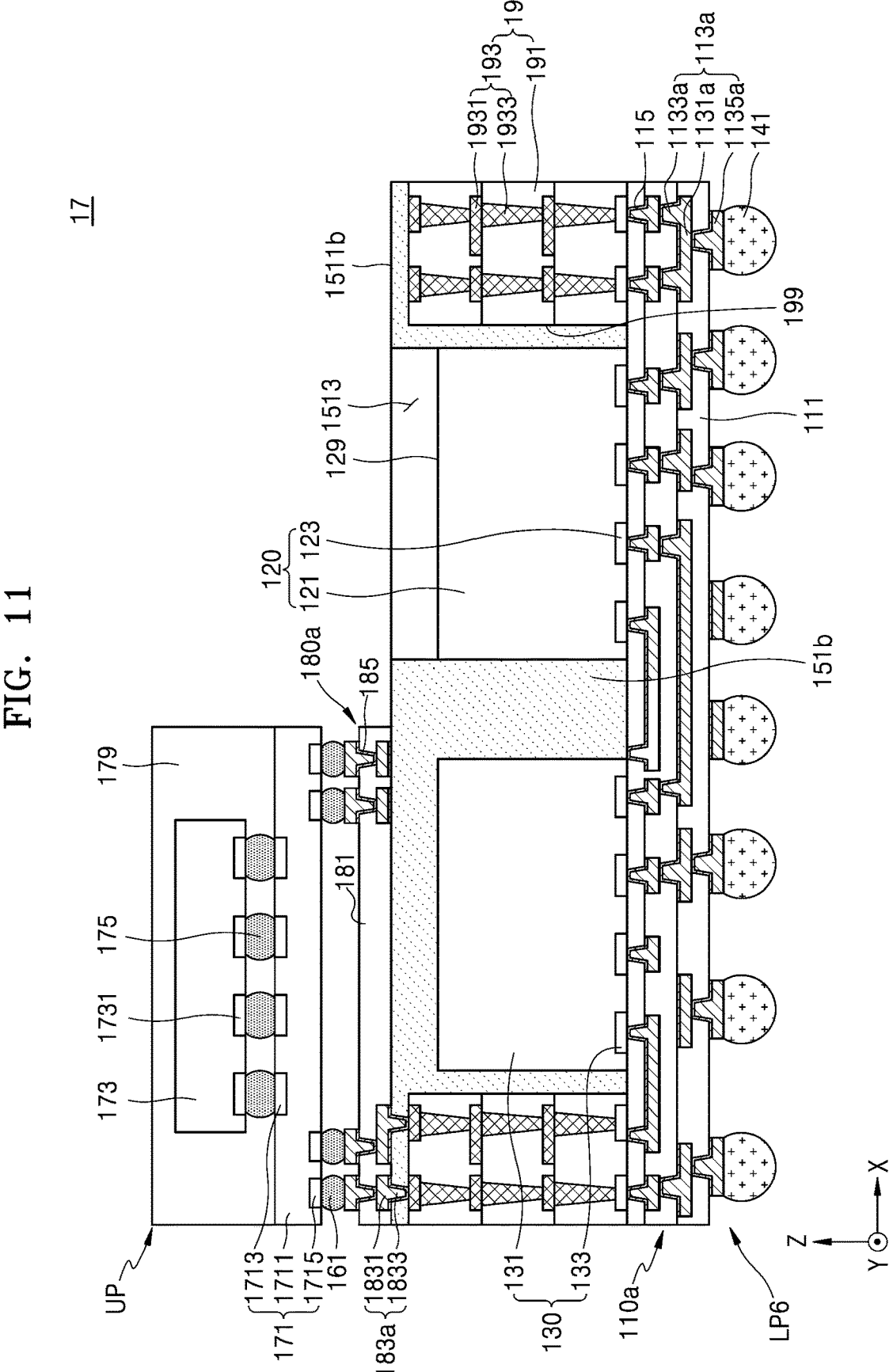
FIG. 11 is a cross-sectional view of a semiconductor package, according to example embodiments.

FIG. 11 is a cross-sectional view of a semiconductor package 17 according to example embodiments. Hereinafter, redundant descriptions give above are omitted or made brief.

Referring to FIG. 11, the semiconductor package 17 may include a connection substrate 190 in a lower package LP6 and a second redistribution structure 180*a* on the lower package LP6.

The connection substrate 190 may be on the first redistribution structure 110*a*. The connection substrate 190 may include an accommodation space 199, which accommodates the first and second semiconductor chips 120 and 130 therein. The accommodation space 199 may include a cavity in a central portion of the connection substrate 190 and may be defined by a substrate base 191 of the connection substrate 190. The inner wall of the connection substrate 190 may define the accommodation space 199 and may surround the side wall of the first semiconductor chip 120 and the side wall of the second semiconductor chip 130.

In embodiments, the connection substrate 190 may include a panel board. For example, the connection substrate 190 may include a PCB, a ceramic substrate, or a wafer for package. In embodiments, the connection substrate 190 may include a multi-layer PCB.

The connection substrate 190 may include the substrate base 191 and an interconnect structure 193, which extends through the substrate base 191.

The substrate base 191 may include at least one material selected from a group consisting of phenol resin, epoxy resin, and polyimide. For example, the substrate base 191 may include at least one material selected from a group consisting of frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

The interconnect structure 193 may correspond to a vertical connection conductor, which electrically connects the first conductive redistribution pattern 113*a* of the first redistribution structure 110*a* to the upper package UP. The interconnect structure 193 may electrically connect the first conductive redistribution pattern 113*a* of the first redistribution structure 110*a* to a second conductive redistribution pattern 183*a* of the second redistribution structure 180*a*. The interconnect structure 193 may include a plurality of interconnect layers 1931 extending in the horizontal direction (e.g., the X direction and/or the Y direction) and a plurality of conductive via patterns 1933 extending in the vertical direction (e.g., the Z direction). The interconnect structure 193 may include copper, nickel, stainless steel, or beryllium copper.

In embodiments, the connection substrate 190 may be a multi-layer substrate, in which the substrate base 191 includes multiple layers. In this case, the interconnect layers 1931 may be at different vertical levels from each other in the substrate base 191. A plurality of interconnect layers 1931 may extend on at least one of the top and bottom surfaces of each of the multiple layers of the substrate base 191. The conductive via patterns 1933 may extend and pass through at least a portion of the substrate base 191 in the vertical direction (e.g., the Z direction), and each of the conductive via patterns 1933 may electrically connect a plurality of interconnect layers 1931 respectively at different vertical levels.

The second redistribution structure 180*a* may be on the lower package LP6. The second redistribution structure 180*a* may provide an electrical connection path for electrically connecting the connection substrate 190 of the lower package LP6 to the upper package UP. The second redistribution structure 180*a* may cover the second semiconductor chip 130 but not the first semiconductor chip 120. The top surface 129 of the first semiconductor chip 120 may be exposed outside the semiconductor package 17 by the groove 1513 of a molding layer 151*b*.

The second redistribution structure 180*a* may include the second redistribution insulating layer 181 and the second conductive redistribution pattern 183*a*. At least one second redistribution insulating layer 181 may extend along a top surface 1511*b* of the molding layer 151*b*. The second conductive redistribution pattern 183*a* may include second conductive layers 1831 and second conductive via patterns 1833. Each of the second conductive layers 1831 may extend along the top surface 1511b of the molding layer 151b or the top surface of the second redistribution insulating layer 181. Each of the second conductive via patterns 1833 may electrically connect second conductive layers 1831 respectively at different vertical levels or electrically connect a second conductive layer 1831 and the interconnect structure 193 of the connection substrate 190. Some of the second conductive via patterns 1833 may pass through the molding layer 151b to be connected to the interconnect structure 193 of the connection substrate 190.

While the inventive concept has been particularly shown and described with reference to embodiments thereof, it will be understood that various changes in form and details may be made therein without departing from the spirit and scope of the following claims.

What is claimed is:

1. A semiconductor package comprising:
a lower package;
an upper package on the lower package; and
an inter-package connector between the lower package and the upper package,
wherein the lower package includes:
    a first redistribution structure including a first redistribution insulating layer and a first redistribution pattern;
    a first semiconductor chip mounted on a first mounting region of the first redistribution structure;
    a second semiconductor chip mounted on a second mounting region of the first redistribution structure, the second mounting region of the first redistribution structure being spaced apart from the first mounting region of the first redistribution structure;
    a molding layer on the first redistribution structure and in contact with a side wall of the first semiconductor chip and a side wall of the second semiconductor chip, the molding layer having a top surface coplanar with a top surface of the first semiconductor chip in a horizontal direction; and
    a conductive post on the second mounting region of the first redistribution structure, the conductive post passing through the molding layer and being electrically connected to the first semiconductor chip through the first redistribution pattern of the first redistribution structure,
wherein the first semiconductor chip includes a logic chip,
wherein the upper package includes a memory chip electrically connected to the first semiconductor chip through the conductive post,
wherein the upper package vertically overlaps the second mounting region of the first redistribution structure and does not vertically overlap the first semiconductor chip, and
wherein no electronic components are disposed on the first mounting region between the top surface of the first semiconductor chip and an outside of the semiconductor package.

2. The semiconductor package of claim 1, wherein the top surface of the first semiconductor chip is exposed to the outside of the semiconductor package.

3. The semiconductor package of claim 1, further comprising:
first chip connection bumps between the first semiconductor chip and the first redistribution structure; and
second chip connection bumps between the second semiconductor chip and the first redistribution structure.

4. The semiconductor package of claim 1, further comprising:
a cover insulating layer covering a portion of the molding layer, the portion of the molding layer vertically overlapping with the second mounting region of the first redistribution structure; and
a conductive bump structure contacting the conductive post through a through hole of the cover insulating layer, the conductive bump structure being configured to electrically connect the conductive post to the inter-package connector.

5. The semiconductor package of claim 4, further comprising:
a conductive adhesive layer between the conductive bump structure and the inter-package connector,
wherein the conductive adhesive layer includes gold (Au).

6. The semiconductor package of claim 1, further comprising a heat dissipation plate attached to the top surface of the first semiconductor chip.

7. The semiconductor package of claim 1, further comprising:
an external connector attached to a lower portion of the first redistribution structure,
wherein the first redistribution pattern includes:
    a first conductive layer extending in the first redistribution insulating layer in the horizontal direction;
    an external connection pad in contact with the external connector; and
    a first conductive via pattern extending between the first conductive layer and the external connection pad, and
wherein the first conductive via pattern has a tapered shape having a horizontal width decreasing toward the external connection pad.

8. The semiconductor package of claim 7, further comprising a seed metal layer between the first conductive via pattern and the external connection pad.

9. The semiconductor package of claim 1, further comprising:
a second redistribution structure on the molding layer, the second redistribution structure vertically overlapping with the second mounting region of the first redistribution structure and including a second redistribution insulating layer and a second redistribution pattern,
wherein the first semiconductor chip includes a first chip pad in a bottom surface thereof,
wherein the second semiconductor chip includes a second chip pad in a top surface thereof, and
wherein the second redistribution pattern electrically connects the conductive post to the second chip pad of the second semiconductor chip.

10. The semiconductor package of claim 9, wherein the second redistribution pattern includes a second conductive via pattern passing through the second redistribution insulating layer and the molding layer and connected to the second chip pad of the second semiconductor chip.

11. The semiconductor package of claim 1, wherein the first redistribution pattern includes:
a first conductive layer extending in the horizontal direction in the first redistribution insulating layer; and
a first conductive via pattern extending between the first conductive layer and a first chip pad of the first semiconductor chip,
wherein the first conductive via pattern has a tapered shape having a horizontal width decreasing toward the first chip pad of the first semiconductor chip.

12. A semiconductor package comprising:

a first redistribution structure including a first mounting region and a second mounting region spaced apart from the first mounting region;

a first semiconductor chip mounted on the first mounting region of the first redistribution structure;

a molding layer contacting a top surface of the first redistribution structure and a side wall of the first semiconductor chip, and not covering a top surface of the first semiconductor chip;

a vertical connection conductor in the molding layer, the vertical connection conductor being electrically connected to the first semiconductor chip through a first redistribution pattern of the first redistribution structure; and an upper semiconductor chip on the molding layer, the upper semiconductor chip vertically overlapping the vertical connection conductor in the second mounting region of the first redistribution structure and being electrically connected to the first semiconductor chip through the vertical connection conductor, wherein the upper semiconductor chip does not vertically overlap the top surface of the first semiconductor chip, and wherein no electronic components are disposed on the first mounting region between the top surface of the first semiconductor chip and an outside of the semiconductor package.

13. The semiconductor package of claim 12, wherein the top surface of the first semiconductor chip is coplanar with a top surface of the molding layer and is exposed to the outside of the semiconductor package.

14. The semiconductor package of claim 12, further comprising:

a thermal conductive adhesive layer on the top surface of the first semiconductor chip; and a heat dissipation plate on the thermal conductive adhesive layer.

15. The semiconductor package of claim 12, further comprising:

a cover insulating layer covering a portion of the molding layer, the portion of the molding layer vertically overlapping with the second mounting region of the first redistribution structure; and a conductive bump structure in a through hole of the cover insulating layer, the conductive bump structure including a lower portion contacting the vertical connection conductor and an upper portion protruding from the cover insulating layer and being configured to electrically connect the vertical connection conductor to the upper semiconductor chip.

16. The semiconductor package of claim 12, further comprising a dummy chip mounted on the second mounting region of the first redistribution structure.

17. The semiconductor package of claim 12, wherein a top surface of the molding layer is at a higher level than the top surface of the first semiconductor chip, and wherein the molding layer includes a groove exposing the top surface of the first semiconductor chip.

18. The semiconductor package of claim 12, further comprising:

a second semiconductor chip mounted on the second mounting region of the first redistribution structure; and a second redistribution structure on the molding layer, the second redistribution structure vertically overlapping with the second mounting region of the first redistribution structure and including a second redistribution insulating layer and a second redistribution pattern, wherein the second semiconductor chip includes a second chip pad in a top surface thereof, and wherein the second redistribution pattern electrically connects the vertical connection conductor and the second chip pad of the second semiconductor chip.

19. The semiconductor package of claim 12, wherein the first semiconductor chip is directly connected to the first redistribution structure, and wherein the first redistribution structure further includes:

a first redistribution insulating layer;

a first conductive layer extending in the first redistribution insulating layer in a horizontal direction; and a first conductive via pattern passing through the first redistribution insulating layer in a vertical direction and electrically connecting the first conductive layer to a first chip pad of the first semiconductor chip, and wherein the first conductive via pattern has a tapered shape having a horizontal width decreasing toward the first chip pad of the first semiconductor chip.

20. A semiconductor package comprising:

a lower package;

an upper package on the lower package;

a heat dissipation plate on the lower package; and an inter-package connector between the lower package and the upper package, wherein the lower package includes:

a first redistribution structure including a first redistribution insulating layer and a first redistribution pattern;

a first semiconductor chip mounted on a first mounting region of the first redistribution structure;

a second semiconductor chip mounted on a second mounting region of the first redistribution structure, the second mounting region of the first redistribution structure being spaced apart from the first mounting region of the first redistribution structure;

a molding layer on the first redistribution structure and in contact with a side wall of the first semiconductor chip and a side wall of the second semiconductor chip; and a conductive post on the second mounting region of the first redistribution structure, the conductive post passing through the molding layer;

wherein the heat dissipation plate is attached to a top surface of the first semiconductor chip, wherein the upper package includes a third semiconductor chip electrically connected through the conductive post to at least one selected from a group consisting of the first semiconductor chip and the second semiconductor chip, and wherein the upper package is spaced apart from the heat dissipation plate in a lateral direction parallel with the top surface of the molding layer and does not vertically overlap the top surface of the first semiconductor chip.

* * * * *